United States Patent
Reagor et al.

(10) Patent No.: US 11,070,210 B2
(45) Date of Patent: Jul. 20, 2021

(54) FLUX-TUNABLE QUBIT DEVICE WITH MULTIPLE JOSEPHSON JUNCTIONS

(71) Applicant: Rigetti & Co, Inc., Berkeley, CA (US)

(72) Inventors: Matthew J. Reagor, Corte Madera, CA (US); Chad Tyler Rigetti, Walnut Creek, CA (US); Eyob A. Sete, Walnut Creek, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 16/783,603

(22) Filed: Feb. 6, 2020

(65) Prior Publication Data

US 2020/0280316 A1 Sep. 3, 2020

Related U.S. Application Data

(63) Continuation of application No. 16/100,841, filed on Aug. 10, 2018, now Pat. No. 10,560,103, which is a continuation of application No. 15/241,783, filed on Aug. 19, 2016, now Pat. No. 10,050,630.

(51) Int. Cl.
*H03K 19/195* (2006.01)
*G06N 10/00* (2019.01)

(52) U.S. Cl.
CPC .......... *H03K 19/195* (2013.01); *G06N 10/00* (2019.01)

(58) Field of Classification Search
CPC ...... H03K 19/195; H03K 3/38; G06N 99/002; G06N 10/00; B82Y 10/00; H01L 39/223
See application file for complete search history.

(56) References Cited

U.S. PATENT DOCUMENTS

| | | |
|---|---|---|
| 6,310,488 B1 | 10/2001 | Hasegawa et al. |
| 8,169,231 B2 | 5/2012 | Berkley |
| 9,355,364 B2 | 5/2016 | Miller et al. |

(Continued)

FOREIGN PATENT DOCUMENTS

| | | |
|---|---|---|
| WO | 2015143439 A1 | 9/2015 |
| WO | 2015178990 A2 | 11/2015 |

(Continued)

OTHER PUBLICATIONS

USPTO, Third Party Submission filed Feb. 26, 2018, in U.S. Appl. No. 15/241,783, 11 pgs.

(Continued)

*Primary Examiner* — Jung Kim
(74) *Attorney, Agent, or Firm* — Henry Patent Law Firm PLLC

(57) ABSTRACT

In a general aspect, a qubit device includes two circuit loops. In some aspects, a first circuit loop includes a first Josephson junction, a second circuit loop includes a second Josephson junction, and the first and second loops are configured to receive a magnetic flux that defines a transition frequency of a qubit device. In some aspects, a quantum integrated circuit includes an inductor connected between a first circuit node and a second circuit node; the first Josephson junction connected in parallel with the inductor between the first circuit node and the second circuit node; and the second Josephson junction connected in parallel with the inductor between the first circuit node and the second circuit node.

15 Claims, 10 Drawing Sheets

(56) References Cited

U.S. PATENT DOCUMENTS

| | | | |
|---|---|---|---|
| 10,050,630 | B2 | 8/2018 | Reagor et al. |
| 10,235,635 | B1 * | 3/2019 | Abdo ............. G06N 10/00 |
| 10,560,103 | B2 | 2/2020 | Reagor et al. |
| 2003/0207766 | A1 † | 11/2003 | Esteve et al. |
| 2004/0077503 | A1 † | 4/2004 | Blais et al. |
| 2005/0224784 | A1 | 10/2005 | Amin et al. |
| 2006/0097747 | A1 | 5/2006 | Amin |
| 2008/0109500 | A1 | 5/2008 | Macready et al. |
| 2009/0078931 | A1 | 3/2009 | Berkley |
| 2009/0267635 | A1 † | 10/2009 | Herr et al. |
| 2012/0005456 | A1 | 1/2012 | Berkley et al. |
| 2015/0111754 | A1 † | 4/2015 | Harris et al. |
| 2017/0262765 | A1 † | 9/2017 | Bourassa |
| 2018/0034425 | A1 | 2/2018 | Bell et al. |
| 2018/0054201 | A1 | 2/2018 | Reagor et al. |

FOREIGN PATENT DOCUMENTS

| | | |
|---|---|---|
| WO | 2015178991 A2 | 11/2015 |
| WO | 2015178992 A2 | 11/2015 |

OTHER PUBLICATIONS

KIPO, International Search Report and Written Opinion dated Nov. 23, 2017, in PCT/US2017/047583, 13 pgs.

USPTO, Third Party Submission filed May 13, 2019, in U.S. Appl. No. 16/100,841, 52 pgs.

USPTO, Third Party Submission filed Mar. 9, 2018, in U.S. Appl. No. 15/241,783, 57 pgs.

EPO, Communication pursuant to Rule 114(2) EPC ("Third party observations") dated Oct. 16, 2019, in EP 16195381.5, 59 pgs.

Pdf download from website of the AQIS 2016 conference details from web.archive.com, home and programme retrieved from https://web.archive.org/web/20180702163804/http://aqis-conf.org/2016/, Jul. 2, 2016, 3 pgs.

Barends, et al., "Coherent Josephson Qubit Suitable for Scalable Quantum Integrated Circuits", arXiv:1304.2322v1 [quant-ph], Apr. 8, 2013, 10 pgs.

Braumuller, Jochen, "Development of tunable transmon qubit in microstrip geometry", Karlsruhe Institute of Technology, Dec. 12, 2013, 96 pages.

Chen, et al., "Qubit architecture with high coherence and fast tunable coupling", arXiv:1402.7367v1, Feb. 28, 2014, 10 pgs.

Devoret, et al., "Quantum Fluctuations in Electrical Circuits", Service de Physique de l'Etat Condense, CEA-Saclay, F91191 Gif-sur-Yvette, France; copyright dated 1997Elsevier Science B. V., 1997, 34 pgs.

Devoret, et al., "Superconducting Circuits for Quantum Information: An Outlook", Science 339, 1169-74, Mar. 2013, 7 pgs.

Devoret, et al., "Superconducting Qubits: A Short Review", arXiv:cond-mat/0411174v1, Nov. 7, 2004, 41 pgs.

European Patent Office, "Extended European Search Report", dated May 12, 2017 in European Application No. 16195381.5, 14 pages.

Harlingen, et al., "Decoherence in Josephson-junction qubits due to critical-current fluctuations", Phys. Rev. B 70, 064517, 2004, 13 pgs.

Harris, R., et al., "Synchronization of Multiple Coupled rf-SQUID Flux Qubits", arxiv.org, Cornell University Library, 201 Olin Library Cornell University Ithaca, NY 14853, Mar. 11, 2009 (Mar. 11, 2009), XP080314735, DOI: 10.1088/1367-2630/11/12/123022, Mar. 11, 2009, 5 pages.

Koch, Jens, et al., "Charge insensitive qubit design derived from the Cooper pair box", Phys. Rev. A 76, 042319.

Kou, A., et al., "A fluxonium-based artificial molecule with a tunable magnetic moment", Oct. 4, 2016 (Oct. 4, 2016), XP055365286, Retrieved from the Internet: URL: https://arxiv.org/pdf/1610.01094v1.pdf [retrieved on Apr. 18, 2017], Oct. 5, 2016, 10 pages.

Langford, "Engineering the quantum", Tutorial presented at AQIS 2016, 16th Asian Quantum Information Science Conference, Taipeh, Taiwan, Aug. 29, 2016, 41 pgs.

Manucharyan, et al., "Superinductance", Ph.D. Dissertation, Yale University, 2012, 162 pgs.

Paauw, et al., "Tuning the Gap of a Superconducting Flux Qubit", Phys. Rev. Lett. 102, 090501, Mar. 2009, 4 pgs.

Pop, et al., "Coherent suppression of electromagnetic dissipation due to superconducting quasiparticles", Nature 508, Apr. 17, 2014, 18 pgs.

Schwartz, et al., "Gradiometric flux qubits with a tunable gap", New J. Phys. 15, 045001, Apr. 2013, 22 pgs.

Strand, J. D., et al., "First-order sideband transitions with flux-driven asymmetric transmon qubits", Physical Review. B, Condensed Matter and Materials Physics, vol. 87, No. 22, Jun. 1, 2013 (Jun. 1, 2013), XP055366364, US, ISSN: 1098-0121, DOI: 10.1103/PhysRevB.87.220505, Jun. 7, 2013, 5 pages.

Wellstood, et al., "Low-frequency noise in dc superconducting quantum interference devices below 1 K", Appl. Phys. Lett. 50, 772, Mar. 1987, 4 pgs.

Yoshihara, et al., "Decoherence of Flux Qubits due to 1/f Flux Noise", Phys. Rev. Lett. 97, 167001, Oct. 2006, 4 pgs.

You-Peng, Zhong, et al., "Progress in superconducting qubits from the perspective of coherence and readout", Chinese Physics B, Chinese Physics B, Bristol GB, vol. 22, No. 11, Nov. 15, 2013 (Nov. 15, 2013), p. 110313, XP020253000, ISSN: 1674-1056, DOI: 10.1088/1674-1056/22/11/110313 [retrieved on Nov. 15, 2013], Oct. 15, 2013, 15 pages.

Zorin, et al., "Background charge noise in metallic single-electron tunneling devices", Physical Review B, vol. 53, No. 20, May 15, 1996, 6 pgs.

EPO, Communication pursuant to Article 94(3) EPC dated Feb. 7, 2020, in EP 16195381.5, 8 pgs.

EPO, Summons to Oral Proceedings mailed Nov. 5, 2020, in EP 16195381.5, 7 pgs.

M.T. Bell et al., Quantum Superinductor with Tunable Non-Linearity, Publication Sep. 18, 2012, pp. 1-10.†

* cited by examiner
† cited by third party

FLUX-TUNABLE QUBIT DEVICE WITH MULTIPLE JOSEPHSON JUNCTIONS

CROSS REFERENCE TO RELATED APPLICATIONS

This application is a continuation of U.S. patent application Ser. No. 16/100,841, filed Aug. 10, 2018, entitled "Flux-Tunable Qubit Device with Multiple Josephson Junctions," which is a continuation of U.S. patent application Ser. No. 15/241,783, filed Aug. 19, 2016, now U.S. Pat. No. 10,050,630, entitled "Flux-Tunable Qubit Device with Multiple Josephson Junctions." The contents of both are hereby incorporated by reference.

BACKGROUND

The following description relates to a flux-tunable qubit device that includes multiple Josephson junctions.

In some quantum computing architectures, qubits are implemented in superconducting circuits. The qubits can be implemented, for example, in circuit devices that include Josephson junctions. Examples include transmon qubits, flux qubits and fluxonium qubits.

DETAILED DESCRIPTION

In some aspects of what is described here, a quantum circuit includes multiple tunable circuit elements. In some implementations, the tunable circuit elements provide in-situ tunability in the quantum circuit, which can be an advantageous resource, for instance, for constructing and operating quantum computers and for other applications. For example, incorporating tunable quantum circuits in a quantum processor may reduce precision requirements for fabrication of the quantum processor. As another example, some quantum algorithms may be implemented on a quantum processor by tuning the quantum circuits to perform operations (e.g., quantum gates or other operations). In some implementations, a tunable quantum circuit can be designed to reduce sensitivity to a dominant noise source, and thereby reduce errors and improve performance of the quantum processor.

Superconducting Quantum Interference Devices (SQUIDs) are an example of a tunable circuit element that can be implemented in a superconducting quantum integrated circuit, in some cases. A SQUID typically includes a superconducting loop with one or more Josephson junctions embedded. The resonance frequency of a SQUID loop depends on the magnetic flux through the superconducting loop. SQUIDs can be used to create magnetic-flux-tunable circuits, including qubit devices having magnetic flux-tunable qubit frequencies.

Figure 1:
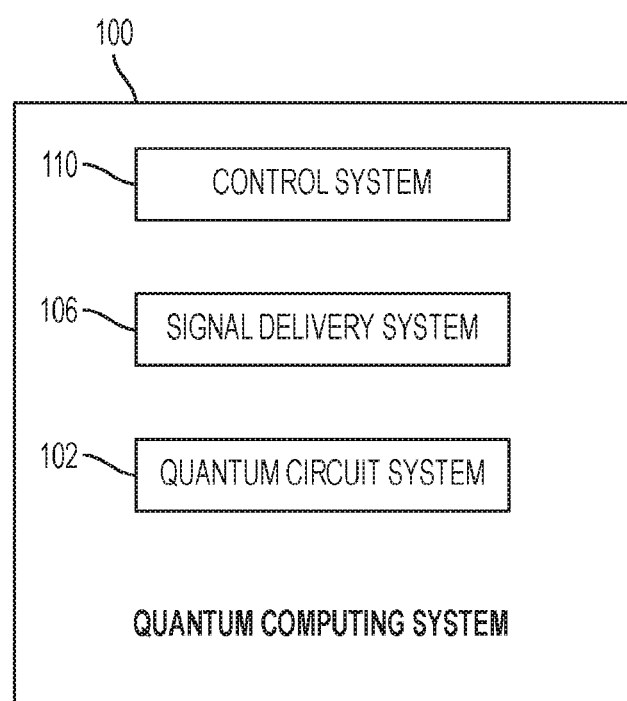
FIG. 1 is a bock diagram of an example quantum computing system.

FIG. 1 is a schematic diagram of an example quantum computing system 100. The example quantum computing system 100 shown in FIG. 1 includes a control system 110, a signal delivery system 106, and a quantum circuit system 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Coupler devices can be used to perform quantum logic operations on single qubits or conditional quantum logic operations on multiple qubits. In some instances, the conditional quantum logic can be performed in a manner that allows large-scale entanglement within the quantum computing device. Control signals can manipulate the quantum states of individual qubits and the joint states of multiple qubits. In some instances, information can be read out from the composite quantum system by measuring the quantum states of the qubit devices.

The example quantum circuit system 102 shown in FIG. 1 is a superconducting quantum integrated circuit that includes qubit devices. The qubit devices are used to store and process quantum information, for example, by operating as ancilla qubits, data qubits or other types of qubits in a quantum algorithm. In some instances, all or part of the quantum circuit system 102 functions as a quantum processor, a quantum memory, or another type of subsystem. The quantum circuit system 102 shown in FIG. 1 can include qubit devices or other devices that are implemented according to the examples shown in FIG. 2A, 2B, 2C, 3A or 3B, or in another manner.

In some implementations, the quantum circuit system 102 includes a two-dimensional or three-dimensional device array, which includes devices arranged in a lattice structure. For instance, a two-dimensional device array can be formed on a two-dimensional wafer surface, where the devices (e.g., qubit devices) are arranged in a two-dimensional lattice structure and configured to communicate with one another. A three-dimensional device array can be formed by a stack of two-dimensional wafers, where the devices are arranged in a three-dimensional lattice structure and configured (e.g., by connections between wafers) to communicate with one another. In some implementations, an electromagnetic waveguide system provides an environment for the device array. For instance, some or all of the quantum circuit system 102 can be housed in an electromagnetic waveguide system that provides a low-noise electromagnetic environment for the qubit devices.

The example quantum circuit system 102, and in some cases all or part of the signal delivery system 106, can be maintained in a controlled cryogenic environment. The environment can be provided, for example, by shielding equipment, cryogenic equipment, and other types of environmental control systems. In some examples, the components in the quantum circuit system 102 operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

In the example quantum circuit system 102, the qubit devices each store a single qubit (a bit of quantum information), and the qubits can collectively define the computational state of a quantum processor or quantum memory. In some implementations, qubit devices in the quantum circuit system 102 can each be encoded with a single bit of quantum information. For instance, each of the qubit devices can define two eigenstates that are used as computational basis states ("0" and "1"), and each qubit device can transition between its computational basis states or exist in an arbitrary superposition of its basis states.

The example quantum circuit system 102 may also include readout devices that selectively interact with the qubit devices to detect their quantum states. For example, the readout devices may provide readout response signals that indicate the computational state of the quantum processor or quantum memory. The readout resonator 284 shown in FIG. 2C and the readout resonator 304 shown in FIG. 3A are examples of readout devices. The quantum circuit system 102 may also include coupler devices that selectively operate on individual qubits or pairs of qubits. For example, the coupler devices may produce entanglement or other multi-qubit states over two or more qubits in the quantum circuit system 102.

In some examples, individual devices (e.g., qubit devices, coupler devices, etc.) in the quantum circuit system 102 each have a tunable operating frequency. For example, the operating frequency can be tuned by applying an offset field. As a particular example, a device may include one or more circuit loops (e.g., SQUID loops or other types of circuit loops) configured to receive a magnetic flux that defines an operating frequency of the device, and the operating frequency may be changed (increased or decreased) by controlling a magnetic field (e.g., an external magnetic field that provides the magnetic flux).

Figure 4:
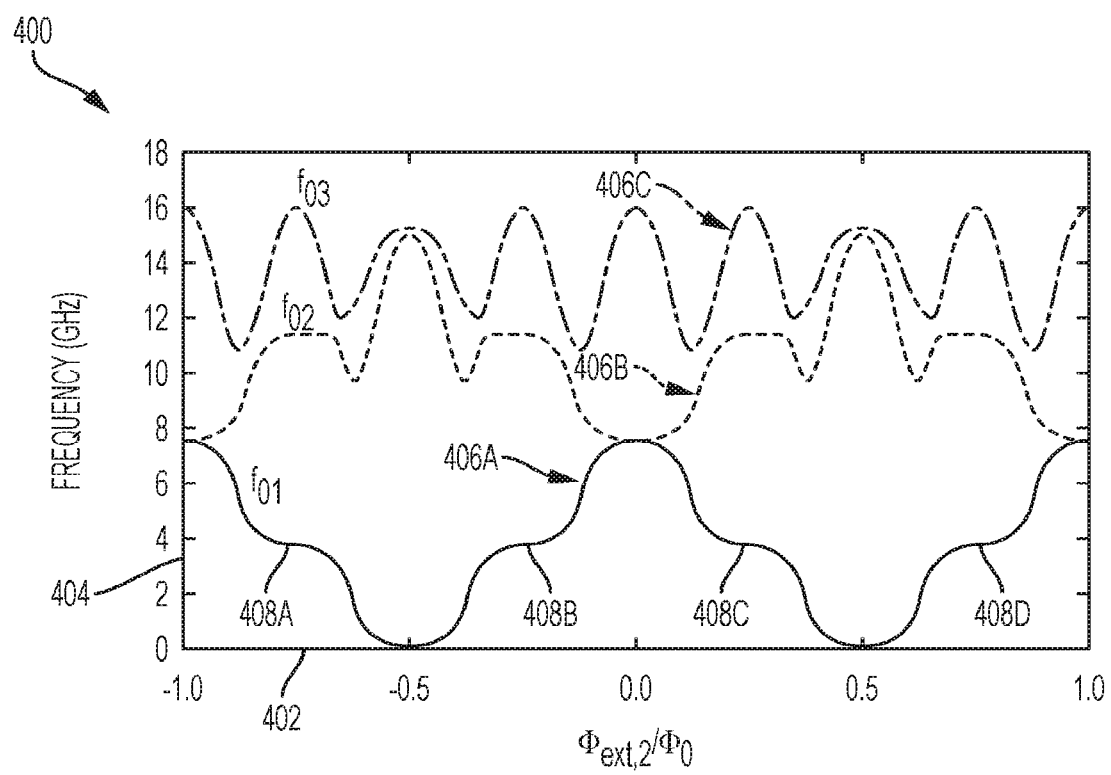
FIG. 4 is a plot showing transition frequencies as a function of external magnetic flux for an example qubit device.

In some implementations, qubit devices in the quantum circuit system 102 each include a first circuit loop and a second circuit loop configured to receive a magnetic flux that defines the qubit frequency of the qubit device. The circuit loops can be configured such that the qubit frequency as a function of the magnetic flux has one or more flux sweet spots. For example, the flux sweet spots shown in FIGS. 4 and 5 are the flux points at which the derivatives (first order and higher order derivatives) of the qubit frequency are substantially zero. In some cases, the qubit frequency has one or more flux sweet spots between the maximum and minimum qubit frequencies over one or more flux quanta. In some instances, tuning a qubit device to a flux sweet spot can improve operation of the qubit device, for example, by reducing sensitivity to magnetic flux noise. In some implementations, the magnetic flux areas of the circuit loops, the external magnetic field applied to the circuit loops, the Josephson energies of the Josephson junctions in the circuit loops or a combination of these and other parameters can be selected such that multiple flux sweet spots are available.

In some instances, operating a qubit device at a flux sweet spot can reduce or eliminate errors (e.g., qubit dephasing) produced by stochastic fluctuations in the external magnetic field. In some contexts, qubit dephasing can be understood in terms of fluctuations of the qubit transition frequency due to its coupling to the environment. This can be described as noise in the external flux parameters ($\Phi_{ext}$) of the Hamiltonian. The fluctuation generally results in two distinct effects: (1) for sufficiently low frequencies, the fluctuations can cause random shifts of the transition frequency of the qubit, leading to pure dephasing, on the time scale of $T_2$; (2) for higher frequencies, the fluctuations can induce transition between qubit states, leading to energy relaxation, on the time scale of Engineering flux sweet spots can reduce the dephasing rate, thus improving the characteristic dephasing time $T_2$. Such improvements can increase quantum gate fidelity or otherwise improve operation of the qubit device.

In some implementations, the example quantum circuit system 102 can process the quantum information stored in the qubits by applying control signals to the qubit devices or other devices (e.g., to coupler devices) housed in a quantum processor cell. The control signals can be configured to encode information in the qubit devices, to process the information by applying logical gates or other types of operations, or to extract information from the qubit devices. In some examples, the operations can be expressed as single-qubit gates, two-qubit gates, or other types of logical gates that operate on one or more qubits. A sequence of operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum circuit system 102. For example, the signal delivery system 106 can receive control signals from the control system 110 and deliver the control signals to the quantum circuit system 102. In some instances, the signal delivery system 106 performs preprocessing, signal conditioning, or other operations to the control signals before delivering them to the quantum circuit system 102.

In some implementations, the signal delivery system 106 includes connectors or other hardware elements that transfer signals between the quantum circuit system 102 and the control system 110. For example, the connection hardware can include signal lines, signal processing hardware, filters, feedthrough devices (e.g., light-tight feedthroughs, etc.), and other types of components. In some implementations, the connection hardware can span multiple different temperature and noise regimes. For example, the connection hardware can include a series of temperature stages (60 K, 3 K, 800 mK, 150 mK) that decrease between a higher temperature regime (e.g., at the control system 110) and a lower temperature regime (e.g., at the quantum circuit system 102).

In the example quantum computing system 100 shown in FIG. 1, the control system 110 controls operation of the quantum circuit system 102. The example control system 110 may include data processors, signal generators, interface components and other types of systems or subsystems. In some cases, the control system 110 includes one or more classical computers or classical computing components. Components of the example control system 110 may operate in a room temperature regime, an intermediate temperature regime, or both. For example, the control system 110 can be configured to operate at much higher temperatures and be subject to much higher levels of noise than are present in the environment of the quantum circuit system 102.

In some implementations, the control system 110 includes a classical computing system that executes software to compile instructions for the quantum circuit system 102. For example, the control system 110 may decompose a quantum logic circuit into discrete control operations or sets of control operations that can be executed by the hardware in the quantum circuit system 102. In some examples, that control system 110 applies a quantum logic circuit by generating signals that cause the qubit devices and other devices in the quantum circuit system 102 to execute operations. For instance, the operations may correspond to single-qubit gates, two-qubit gates, qubit measurements, etc. The control system 110 can generate control signals that are communicated to the quantum circuit system 102 by the signal delivery system 106, and the devices in the quantum circuit system 102 execute the operations in response to the control signals.

In some aspects of operation, information is encoded in data qubits residing in the quantum circuit system 102. For example, a single qubit of information may be written to, stored on or otherwise encoded in each data qubit. In some cases, to encode information in the data qubits, the control system 110 sends control signals to the quantum circuit system 102. The control signals can each be addressed to individual qubit devices, and can be configured to modify the quantum states of the respective qubits to which they are addressed. For example, the control signals may be configured to transit the qubit devices to a particular computational state, to apply logical operations to the qubits, or to otherwise encode information in the qubit devices.

In some aspects of operation, the control system 110 includes a microwave signal source (e.g., an arbitrary waveform generator), a bias signal source (e.g., a direct current source) and other components that provide control signals to the signal delivery system 106. The control signals can include analog signals that are generated based on digital control information provided, for instance, by a classical processor in the control system 110. In some instances, the control signals are generated by the control system 110 at high temperature (e.g., above cryogenic temperatures) and delivered to the quantum circuit system 102 operating at low temperature (e.g., at cryogenic temperatures). Within the quantum circuit system 102, the control signals can be delivered to individual circuit devices, for instance, to apply quantum logic gates, readout qubit states or to perform other operations.

In some aspects of operation, the quantum circuit system 102 produces signals that are delivered to the control system 110 by the by the signal delivery system 106. For example, readout devices may produce readout response signals (e.g., in response to a readout interrogation signal) that are transferred to the signal delivery system 106. The readout response signals can include analog signals that are produced at low temperature and delivered to the control system 110 operating at a higher temperature. The control system 110 may include conversion hardware that digitizes the readout response signals to be processed, for example, by a classical processor in the control system 110.

In some aspects of operation, the control system 110 operates qubit devices in the quantum circuit system 102. For example, operating a qubit device may include controlling a magnetic flux received by one or more circuit loops (e.g., SQUID loops) of the qubit device, and controlling the magnetic flux can tune the transition frequencies of the qubit device. In some instances, controlling the magnetic flux can include tuning the qubit frequency of the qubit device to a flux sweet spot, and the control system 110 can perform a readout of the qubit device while the transition frequency is parked at the flux sweet spot. For example, the control system 110 may control the magnetic flux by sending a DC bias signal to a flux bias device that is coupled to the qubit device, and the control system 110 may perform a readout by sending an microwave readout interrogation signal to a readout device that is coupled to the qubit device. In some instances, controlling the magnetic flux can include tuning the transition frequency of the qubit device away from a flux sweet spot, and the control system 110 can apply a logic gate to the qubit device while the transition frequency is parked away from the flux sweet spot. For example, the control system 110 may control the magnetic flux by sending a DC bias signal to a flux bias device that is coupled to the qubit device, and the control system 110 may apply a logic gate by sending a microwave control signal to the qubit device.

Figure 2A:
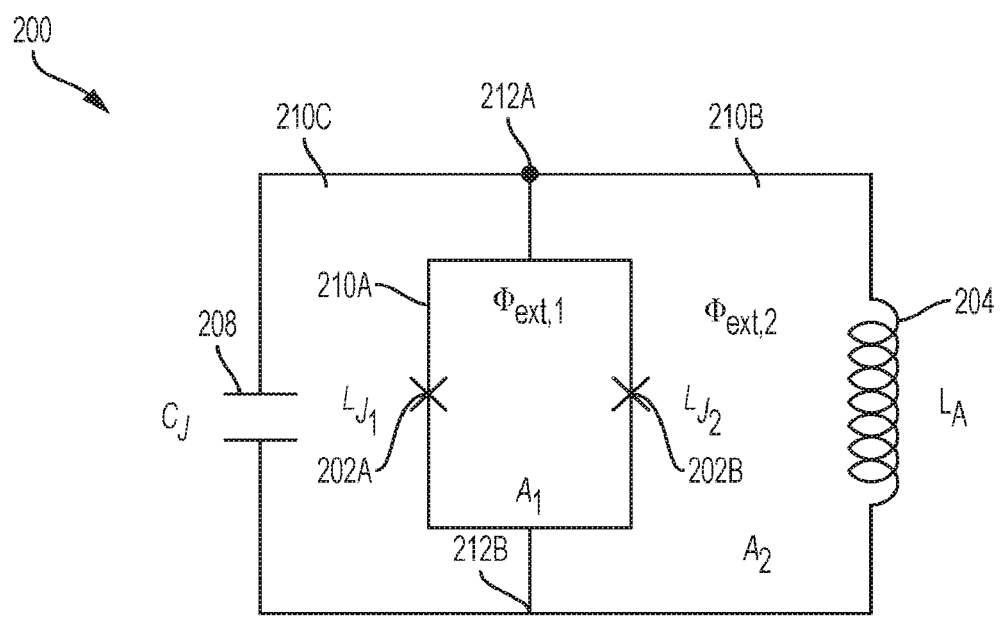
FIG. 2A shows an equivalent circuit for an example qubit device.

FIG. 2A is a circuit diagram showing an equivalent circuit for an example qubit device 200. The example qubit device 200 represented in FIG. 2A includes a first Josephson junction ($J_1$) 202A, a second Josephson junction ($J_2$) 202B, an inductor 204, and a capacitor 208. The first Josephson junction ($J_1$) 202A has a first inductance ($L_{J_1}$) and a first Josephson energy ($E_{J_1}$); the second Josephson junction ($J_2$) 202B has a second inductance ($L_{J_2}$) and a second Josephson energy ($E_{J_2}$); the inductor 204 has an inductance $L_A$; and the capacitor 208 has a capacitance $C_J$. In the example shown in FIG. 2A, the first and second Josephson junctions each include a respective parasitic capacitance, which is represented by the capacitance $C_J$ of the capacitor 208. The example qubit device 200 may include additional or different features, including connections with other circuit devices, in some cases.

Figure 3A:
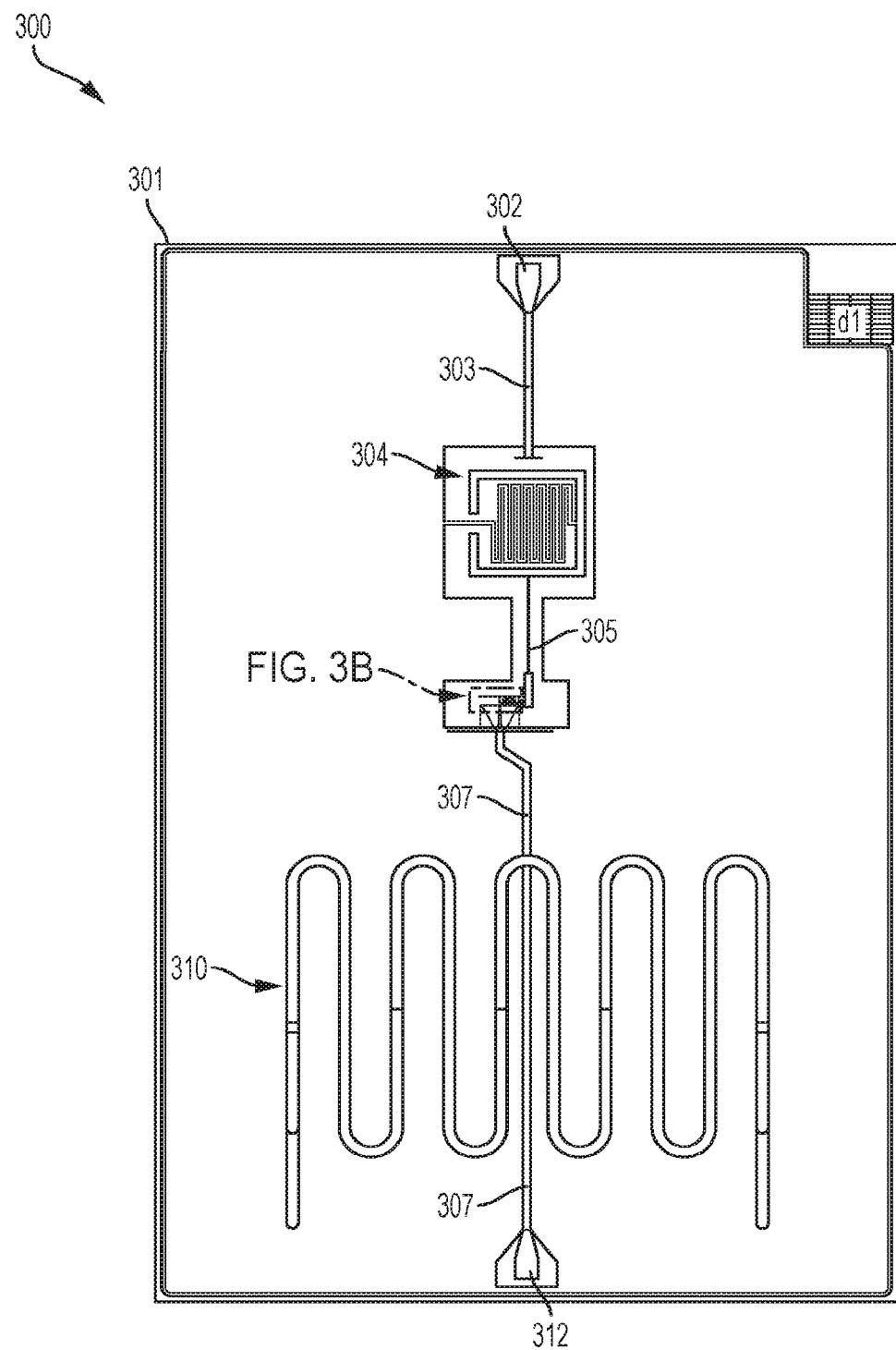
FIGS. 3A and 3B show an example quantum integrated circuit.
Figure 3B:
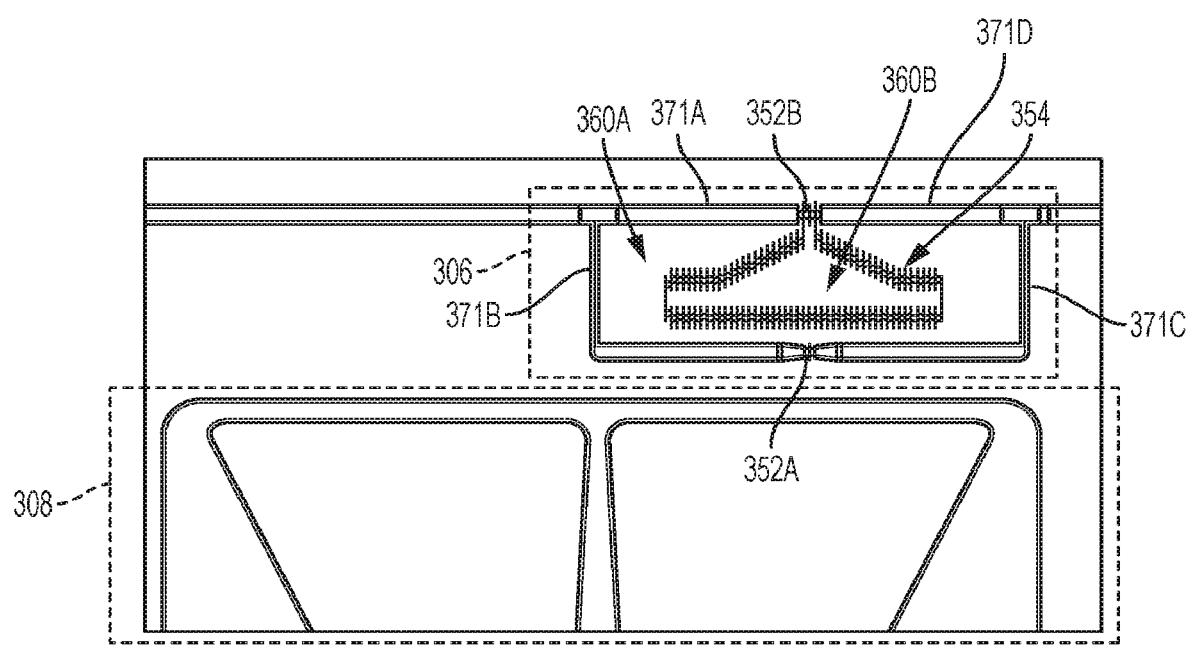

In some cases, the inductor 204 can be implemented as a superinductor. A superinductor can be implemented, for example, as a serial array of Josephson junctions (e.g., as shown in FIG. 3B or otherwise), as a superconducting wire (e.g., a superconducting wire having a high kinetic inductance) or as another type of structure. In some cases, the capacitor 208 can be implemented as a physical capacitor device in the quantum integrated circuit. In some cases, the capacitance $C_J$ of the capacitor 208 represents the parasitic capacitance of the first and second Josephson junctions.

In the example qubit device 200 represented in FIG. 2A, the inductor 204 is connected between a first circuit node 212A and a second circuit node 212B; the first Josephson junction ($J_1$) 202A is connected in parallel with the inductor 204 between the first circuit node 212A and the second circuit node 212B; the second Josephson junction ($J_2$) 202B is connected in parallel with the inductor 204 between the first circuit node 212A and the second circuit node 212B. As shown, the parasitic capacitance $C_J$ of the Josephson junctions, represented by the capacitor 208, is connected in parallel with the inductor 204. The circuit elements may be connected in another manner in some cases.

In some implementations, the example qubit device 200 shown in FIG. 2A can be implemented as a superconducting quantum integrated circuit. For example, the qubit device 200 may be fabricated on a substrate (e.g., a sapphire substrate, a silicon substrate, etc.) that supports one or more layers of superconducting material (e.g., aluminum, niobium, etc.) and insulating materials (e.g., aluminum oxide). For example, the Josephson junctions 202A, 202B may be formed by a layer of aluminum oxide sandwiched between layers of aluminum superconducting material. In some cases, the inductor 204 can be formed by a series of such Josephson junctions. Connections between devices may be formed by superconducting wire (e.g., aluminum).

As shown in FIG. 2A, the example qubit device 200 includes three circuit loops—a first circuit loop 210A, a second circuit loop 210B and a third circuit loop 210C. The first circuit loop 210A includes the first Josephson junction ($J_1$) 202A and the second Josephson junction ($J_2$) 202B; the second circuit loop 210B includes the second Josephson junction ($J_2$) 202B and the inductor 204; and the third circuit loop 210C includes the first Josephson junction ($J_1$) 202A and the capacitor 208. The qubit device 200 may include additional or different circuit loops in some cases. In some instances, the qubit device 200 does not include the third circuit loop 210C, for example, where the capacitor 208 represents the parasitic capacitance of the Josephson junctions.

In some example quantum integrated circuits, a circuit loop can be implemented as a continuous loop defining an interior area that can receive magnetic flux during operation of the quantum integrated circuit. For example, the interior area of the circuit loop can be defined by the boundaries of circuit elements (e.g., conductors, devices, etc.) on one or more chips or wafers. In some examples, a circuit loop includes circuit elements that define an interior perimeter of the circuit loop, and the interior perimeter defines the boundary of the magnetic flux area. In some cases, the magnetic flux (along with electronic attributes of the circuit elements) defines an operating frequency or other operating parameters of the circuit loop or a device that includes the circuit loop.

In the example shown in FIG. 2A, the first and second circuit loops 210A, 210B are configured to receive, during operation of the qubit device 200, a magnetic flux that defines a transition frequency of the qubit device 200. As shown, the first circuit loop 210A has a first interior area ($A_1$) configured to receive a first portion $\Phi_{ext,1}$ of the external magnetic flux; and the second circuit loop 210B has a second interior area ($A_2$) configured to receive a second portion $\Phi_{ext,2}$ of the external magnetic flux. As shown in FIG. 2A, the first interior area ($A_1$) and the second interior area ($A_2$) are exclusive areas. For instance, the first interior area ($A_1$) does not contain any portion of the second interior area ($A_2$), and vice versa.

The external magnetic fluxes ($\Phi_{ext,1}$, $\Phi_{ext,2}$) are produced by an external magnetic field threading through the interior areas ($A_1$, $A_2$). The external magnetic field can be generated by one or more sources, which may include magnetic field sources on the chip with the qubit device, magnetic field sources external to the chip or external to the quantum processor, one or more noise sources in the environment or a combination of them. As an example, in some cases, to generate the external magnetic field, a DC signal can be applied to an inductor that has a mutual inductance with the first and second circuit loops 210A, 210B.

In some examples, the external magnetic fluxes ($\Phi_{ext,1}$, $\Phi_{ext,2}$) are produced by global flux biasing. Global flux biasing can be implemented, for instance, by using a large coil to generate a relatively uniform magnetic field over the spatial extent of the qubit device. The coil can be located below or above the chip, about the chip, or in another location that provides inductive coupling with the circuit loops of the qubit device. When the magnetic field over the spatial extent of the magnetic flux areas ($A_1$, $A_2$) is uniform, the ratio of the external magnetic fluxes equals the ratio of the magnetic flux areas ($r_\Phi = \Phi_{ext,1}/\Phi_{ext,2} = A_1/A_2$ in some instances).

In some examples, the external magnetic fluxes ($\Phi_{ext,1}$, $\Phi_{ext,2}$) are produced by on-chip flux biasing. On-chip flux biasing can be implemented, for instance, by using an inductor on the chip substrate (e.g., near the qubit device 200) to generate a magnetic field. On-chip flux biasing can produce a spatially-varying magnetic field over the spatial extent of the qubit device. For instance, the external magnetic field may be radially-dependent with respect to the flux bias device. When the magnetic field over the spatial extent of the magnetic flux areas ($A_1$, $A_2$) is not uniform, the ratio of the external magnetic fluxes may be unequal to the ratio of the magnetic flux areas ($r_\Phi = \Phi_{ext,1}/\Phi_{ext,2} \neq A_1/A_2$ in some instances).

In some instances, transition frequencies of the qubit device 200 can be modified (increased or decreased) by controlling the external magnetic flux, for example, by modifying (increasing or decreasing) the strength of an external magnetic field applied the qubit device 200. The transition frequencies defined by the external magnetic flux can be the frequencies associated with energy differences between the quantum energy levels of the qubit device 200, for example, between the ground state and the first excited state. In some cases, the qubit frequency, which is the transition frequency between the computational basis states of the qubit device 200, is among the transition frequencies defined by the external magnetic flux.

In some implementations, the example qubit device 200 can be configured to provide a flux sweet spot in the qubit frequency (e.g., the transition frequency between the ground state and first excited state of the qubit). For example, values of the Josephson energies and the interior areas can be selected such that the qubit device 200 has multiple flux sweet spots. In some instances, the qubit device 200 is configured to have flux sweet spots, for example, by setting $\Phi_{ext,1} > \Phi_{ext,2}$, such that the external magnetic flux $\Phi_{ext,1}$ through the first circuit loop 210A is larger than the external magnetic flux $\Phi_{ext,2}$ through the second circuit loop 210B.

To analyze the dephasing time ($T_2$) in the case of weak fluctuations in the external magnetic field applied to the example qubit device 200 shown in FIG. 2A, each external parameter in the qubit Hamiltonian can be decomposed into its controlled DC value and fluctuations around it, for example, $$\Phi_{ext,2} = \Phi_{ext,2}^{(0)} + \delta\Phi_{ext,2}.$$

The Hamiltonian of the qubit, expressed in terms of Pauli operators, can be expanded in Taylor series as $$H_q = \frac{1}{2}\left[\hbar\omega_{01} + \hbar\frac{\partial\omega_{01}}{\partial\Phi_{ext,2}}\delta\Phi_{ext,2} + \frac{\hbar^2}{2}\frac{\partial^2\omega_{01}}{\partial\Phi_{ext,2}^2}\delta\Phi_{ext,2}^2 + \ldots\right]\sigma_z.$$

Considering the first two terms in the Hamiltonian, the decay of superposition state or the off-diagonal density matrix elements can be expressed $$\rho_{01}(t) = e^{i\omega_{01}t}\langle\exp[i\delta v(t)]\rangle,$$

$$\delta v(t) = \frac{\partial\omega_{01}}{\partial\Phi_{ext,2}}\int_0^t dt'\delta\Phi_{ext,2}(t'),$$

where $\delta v(t)$ is the random noise accumulated. Assuming Gaussian noise, one can calculate the decay law as $$\langle\exp[i\delta v(t)]\rangle = \exp\left(-\frac{\langle\delta v\rangle^2}{2}\right) = \exp\left[-\frac{t^2}{2}\left(\frac{\partial\omega_{01}}{\partial\Phi_{ext,2}}\right)^2\int_{-\infty}^{\infty}d\omega s_\Phi(\omega)sinc^2\left(\frac{\omega t}{2}\right)\right].$$

For noise spectra singular at $\omega=0$, a spectral density can be approximated as $$S_{\Phi_2} = \frac{2\pi A_\Phi^2}{\omega^\mu},$$

where $0.8<\mu<1.3$ and $A_\Phi$ is the amplitude of the noise. For flux noise $A_\Phi=10^{-6}\Phi_0-10^{-5}\Phi_0$. Introducing infrared and ultraviolet cut off frequencies $\omega_i$ and $\omega_{uv}$, the dephasing becomes $$\langle\exp[i\delta\nu(t)]\rangle = \exp\left[-A^2\left(\frac{\partial\omega_{01}}{\partial\Phi_{ext,2}}\right)^2 t^2 |\ln\omega_i t|\right]$$

which is valid for $\omega_i t \ll 1$ and $\omega_u t \gg 1$. The dephasing rate due to the flux noise can be introduced as $$\Gamma_\phi^{(1)} = A\left|\frac{\partial\omega_{01}}{\partial\Phi_{ext,2}}\right|.$$

In this example, this expression of the dephasing rate is valid when the flux is sufficiently small. If the derivative of the qubit frequency is zero at a flux value, the flux value may be considered a flux sweet spot and the coherence time ($T_2$) may become indefinitely long (e.g., virtually infinite). In some cases, the second order contribution neglected in Eq. (3) may dominate at the flux sweet spot. In that case, the contribution of the second order term to the dephasing rate can be estimated through the formula $$\Gamma_\phi^{(2)} \approx \frac{1}{A^2\pi^2}\frac{\partial^2\omega_{01}}{\partial\Phi_{ext,2}^2}$$

In some cases, the total dephasing rate due to flux noise can be expressed as the sum of all order derivatives $$\Gamma_\phi = \sum_i \Gamma_\Phi^{(i)}$$

and is related to $T_2$ as $$\frac{1}{T_2} = \frac{1}{2T_1} + \Gamma_\phi + \text{other dephasing rates,}$$

where $T_1$ is the energy relaxation time for the qubit.

In some cases (e.g., in the examples shown in FIGS. 4, 5A, and 5B), one or more flux sweet spots reside at the minima and maxima of the qubit frequency, and one or more additional flux sweet spots reside between the minima and maxima of the qubit frequency. For instance, the qubit frequency as a function of the magnetic flux can include a minimum, a maximum, and one or more flux sweet spots between the minimum and maximum. In some instances, the quantum state of the qubit device 200 has reduced sensitivity to magnetic flux noise when the qubit device 200 is operated with the qubit frequency tuned to a flux sweet spot. For example, the first derivative of the qubit frequency as a function of the external flux can be zero at a flux sweet spot. In some cases, when the qubit device 200 is operated at a flux sweet spot, second derivative may dominate the rate of decay of the off-diagonal terms in the qubit density matrix; the first-order terms may approach zero. When the first order terms approach zero, the characteristic dephasing time ($T_2$) may approach infinity. Accordingly, operating the qubit device 200 at a flux sweet spot can extend the coherence time and provide better performance of the qubit device.

In some implementations of the qubit device 200 shown in FIG. 2A, a ratio of the first Josephson energy ($E_{J_1}$) to the second Josephson energy ($E_{J_2}$) can be equal to an integer value (e.g., exactly, approximately or substantially an integer). For example, the values of the Josephson energies can be selected such that $$r_{JE} = \frac{E_{J_1}}{E_{J_2}} = N_1$$

where $r_{JE}$ is the Josephson energy ratio, and $N_1$ is a non-zero integer value (e.g., 1, 2, 3, 4, or a higher integer value). In some cases, the Josephson energy ratio is substantially an integer value, for example, within ±0.10 of an integer value, or as close to an integer value as can be achieved by the selected fabrication processes. In some cases, the Josephson energy ratio can be a real value that is not an integer.

In some implementations of the qubit device 200 shown in FIG. 2A, values of the magnetic flux areas ($A_1$, $A_2$) can be selected and the external magnetic field can be configured such that ratio of the external magnetic fluxes ($\Phi_{ext,1}$) $\Phi_{ext,2}$) is equal to an integer value (e.g., exactly, approximately or substantially an integer). For example, the magnetic flux parameters can be selected such that $$r_\Phi = \frac{\Phi_{ext,1}}{\Phi_{ext,2}} = N_2$$

where $r_\Phi$ is the magnetic flux ratio, and $N_2$ is a non-zero integer value (e.g., 1, 2, 3, 4, or a higher integer value). In some cases, the magnetic flux ratio is substantially an integer value, for example, within ±0.10 of an integer value, or as close to an integer value as can be achieved by the selected fabrication processes. In some cases, the magnetic flux ratio can be a real value that is not an integer.

In some implementations, the qubit device 200 can be configured such that the Josephson energy ratio ($r_{JE}$) of the qubit device equals (e.g., exactly, approximately or substantially equals) a magnetic flux ratio ($r_\Phi$) of the qubit device 200 minus one (i.e., $r_{JE}=r_\Phi-1$). In some cases, a qubit device can be configured such that a Josephson energy ratio substantially equals a magnetic flux ratio minus one, for example, within ±0.10 of exact equality, or as close to equality as can be achieved by the selected fabrication processes. In some cases, the values of the Josephson energy ratio and the magnetic flux ratio have another relationship.

In some aspects of operation, the qubit device 200 is operated by a control system that communicates with a quantum integrated circuit that includes the qubit device 200. For example, the control system may tune the qubit frequency of the qubit device by controlling the level of current in a flux bias device, thereby controlling the external magnetic fluxes ($\Phi_{ext,1}$, $\Phi_{ext,2}$). In some instances, during operation of the qubit device 200, the external magnetic fluxes ($\Phi_{ext,1}$, $\Phi_{ext,2}$) are modified (increased or decreased) to tune the qubit frequency to a flux sweet spot. In some instances, during operation of the qubit device 200, the external magnetic fluxes ($\Phi_{ext,1}$, $\Phi_{ext,2}$) are modified (increased or decreased) to tune the qubit frequency away from a flux sweet spot. Operating the qubit device 200 may include, for example, performing readout operations, applying quantum logic gates or other operations with the qubit frequency being tuned to a flux sweet spot or away from a flux sweet spot.

Figure 2B:
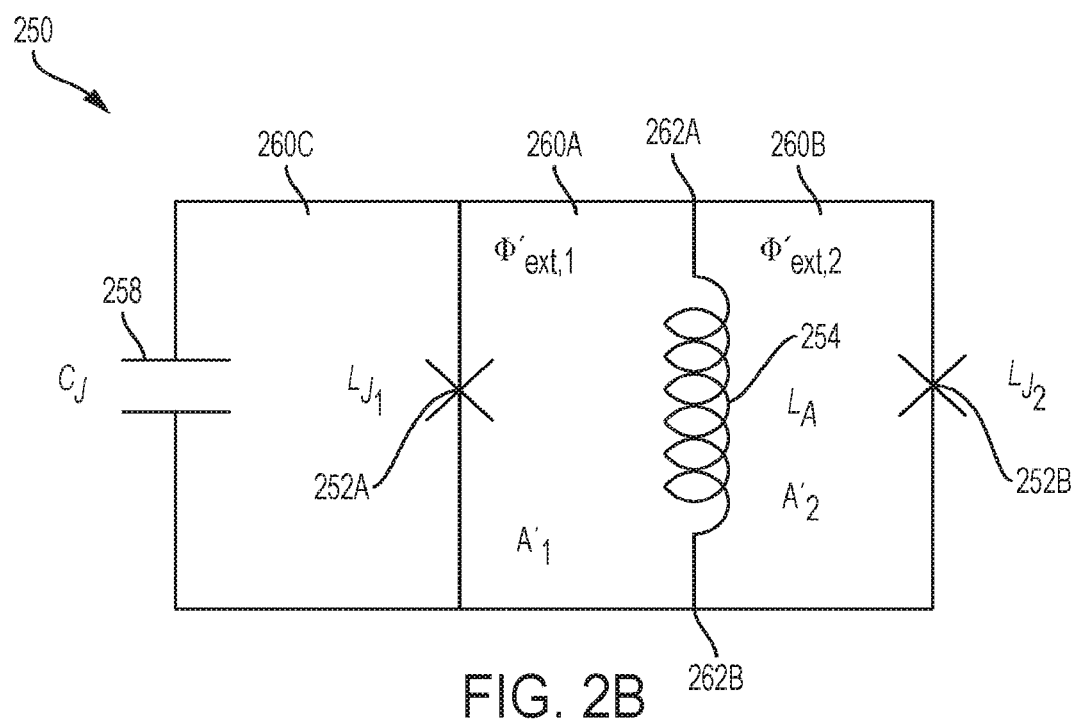
FIG. 2B shows an equivalent circuit for another example qubit device.

FIG. 2B shows an equivalent circuit for another example qubit device 250. The example qubit device 250 represented in FIG. 2B has similar circuit elements as the example qubit device 200 represented in FIG. 2A, with the circuit elements in another arrangement. The example qubit device 250 represented in FIG. 2B includes a first Josephson junction ($J_1$) 252A, a second Josephson junction ($J_2$) 252B, an inductor 254, and a capacitor 258. In this example, the first Josephson junction ($J_1$) 252A has the first inductance ($L_{J_1}$) and the first Josephson energy ($E_{J_1}$); the second Josephson junction ($J_2$) 252B has the second inductance ($L_{J_2}$) and the second Josephson energy ($E_{J_2}$); the inductor 254 has the inductance $L_A$; and the capacitor 258 has the capacitance $C_J$. In the example shown in FIG. 2B, the first and second Josephson junctions each include a respective parasitic capacitance, which is represented by the capacitance $C_J$ of the capacitor 258. The example qubit device 250 may include additional or different features, including connections with other circuit devices, in some cases.

In the example qubit device 250 represented in FIG. 2B, the inductor 254 is connected between a first circuit node 262A and a second circuit node 262B; the first Josephson junction ($J_1$) 252A is connected in parallel with the inductor 254 between the first circuit node 262A and the second circuit node 262B; the second Josephson junction ($J_2$) 252B is connected in parallel with the inductor 254 between the first circuit node 262A and the second circuit node 262B. As shown, the parasitic capacitance $C_J$ of the Josephson junctions, represented by the capacitor 258, is connected in parallel with the inductor 254. The circuit elements may be connected in another manner in some cases.

In some implementations, the example qubit device 250 shown in FIG. 2B can be implemented as an superconducting quantum integrated circuit. The individual elements of the qubit device 250 shown in FIG. 2B (the first Josephson junction ($J_1$) 252A, second Josephson junction ($J_2$) 252B, the inductor 254, and the capacitor 258) may be implemented and fabricated as the analogous elements of the qubit device 200 shown in FIG. 2A, or they may be implemented and fabricated in another manner in some cases.

As shown in FIG. 2B, the example qubit device 250 includes three circuit loops—a first circuit loop 260A, a second circuit loop 260B and a third circuit loop 260C. The first circuit loop 260A includes the first Josephson junction ($J_1$) 252A and the inductor 254; the second circuit loop 260B includes the second Josephson junction ($J_2$) 252B and the inductor 254; and the third circuit loop 260C includes the first Josephson junction ($J_1$) 252A and the capacitor 258. The qubit device 250 may include additional or different circuit loops in some cases. In some instances, the qubit device 250 does not include the third circuit loop 260C, for example, where the capacitor 258 represents the parasitic capacitance of the Josephson junctions rather than a separate capacitor device.

In the example shown in FIG. 2B, the first and second circuit loops 260A, 260B are configured to receive, during operation of the qubit device 250, a magnetic flux that defines a transition frequency of the qubit device 250. As shown, the first circuit loop 260A has a first interior area ($A'_1$) configured to receive a first portion $\Phi'_{ext,1}$ of the external magnetic flux; and the second circuit loop 260B has a second interior area ($A'_2$) configured to receive a second portion $\Phi'_{ext,2}$ of the external magnetic flux. When the magnetic field over the spatial extent of the magnetic flux areas ($A'_1$, $A'_2$) is uniform, the ratio of the external magnetic fluxes equals the ratio of the magnetic flux areas ($r_{\Phi'} = \Phi'_{ext,2}/\Phi'_{ext,1} = A'_2/A'_1$ in some instances).

In some implementations, the example qubit device 250 can be configured to provide a flux sweet spot in the qubit frequency (e.g., the transition frequency between the ground state and first excited state of the qubit), analogous to the flux sweet spots described with respect to FIG. 2A. For example, values of the Josephson energies and the interior areas can be selected such that the qubit device 250 has multiple flux sweet spots. In some instances, the qubit device 250 is configured to have flux sweet spots, for example, by setting $\Phi'_{ext,2} > \Phi'_{ext,1}$, such that the external magnetic flux $\Phi'_{ext,2}$ through the second circuit loop 260B is larger than the external magnetic flux $\Phi'_{ext,1}$ through the first circuit loop 260A.

In some implementations of the qubit device 250 shown in FIG. 2B, a ratio of the first Josephson energy ($E_{J_1}$) to the second Josephson energy ($E_{J_2}$) can be equal to an integer value (e.g., exactly, approximately or substantially an integer). For example, the values of the Josephson energies can be selected such that $$r_{JE} = \frac{E_{J_1}}{E_{J_2}} = N_1$$

where $r_{JE}$ is the Josephson energy ratio, and $N_1$ is a non-zero integer value (e.g., 1, 2, 3, 4, or a higher integer value). In some implementations of the qubit device 250 shown in FIG. 2B, values of the magnetic flux areas ($A'_1$, $A'_2$) can be selected and the external magnetic field can be configured such that ratio of the external magnetic fluxes ($\Phi'_{ext,1}$, $\Phi'_{ext,2}$) is equal to an integer value (e.g., exactly, approximately or substantially an integer). For example, the magnetic flux parameters can be selected such that $$r_{\Phi'} = \frac{\Phi'_{ext,2}}{\Phi'_{ext,1}} = N_2$$

where $r_{\Phi'}$ is the magnetic flux ratio, and $N_2$ is a non-zero integer value (e.g., 1, 2, 3, 4, or a higher integer value). In some implementations, the qubit device 250 can be configured such that the Josephson energy ratio ($r_{JE}$) of the qubit device 250 equals (e.g., exactly, approximately or substantially equals) the magnetic flux ratio ($r_{\Phi'}$) of the qubit device minus one (i.e., $r_{JE} = r_{\Phi'} - 1$). The qubit device 250 may be implemented with other parameters or another configuration.

In some aspects of operation, the example qubit device 250 shown in FIG. 2B is operated in the same manner, or in a similar manner, as described with respect to the qubit device 200 shown in FIG. 2A. For example, a control system may tune the qubit frequency of the qubit device 250 by controlling the level of current in a flux bias device, thereby controlling the external magnetic fluxes ($\Phi'_{ext,1}$, $\Phi'_{ext,2}$). In some instances, during operation of the qubit device 250, the external magnetic fluxes ($\Phi_{ext,1}$, $\Phi_{ext,2}$) are modified (increased or decreased) to tune the qubit frequency to a flux sweet spot or away from a flux sweet spot.

Figure 2C:
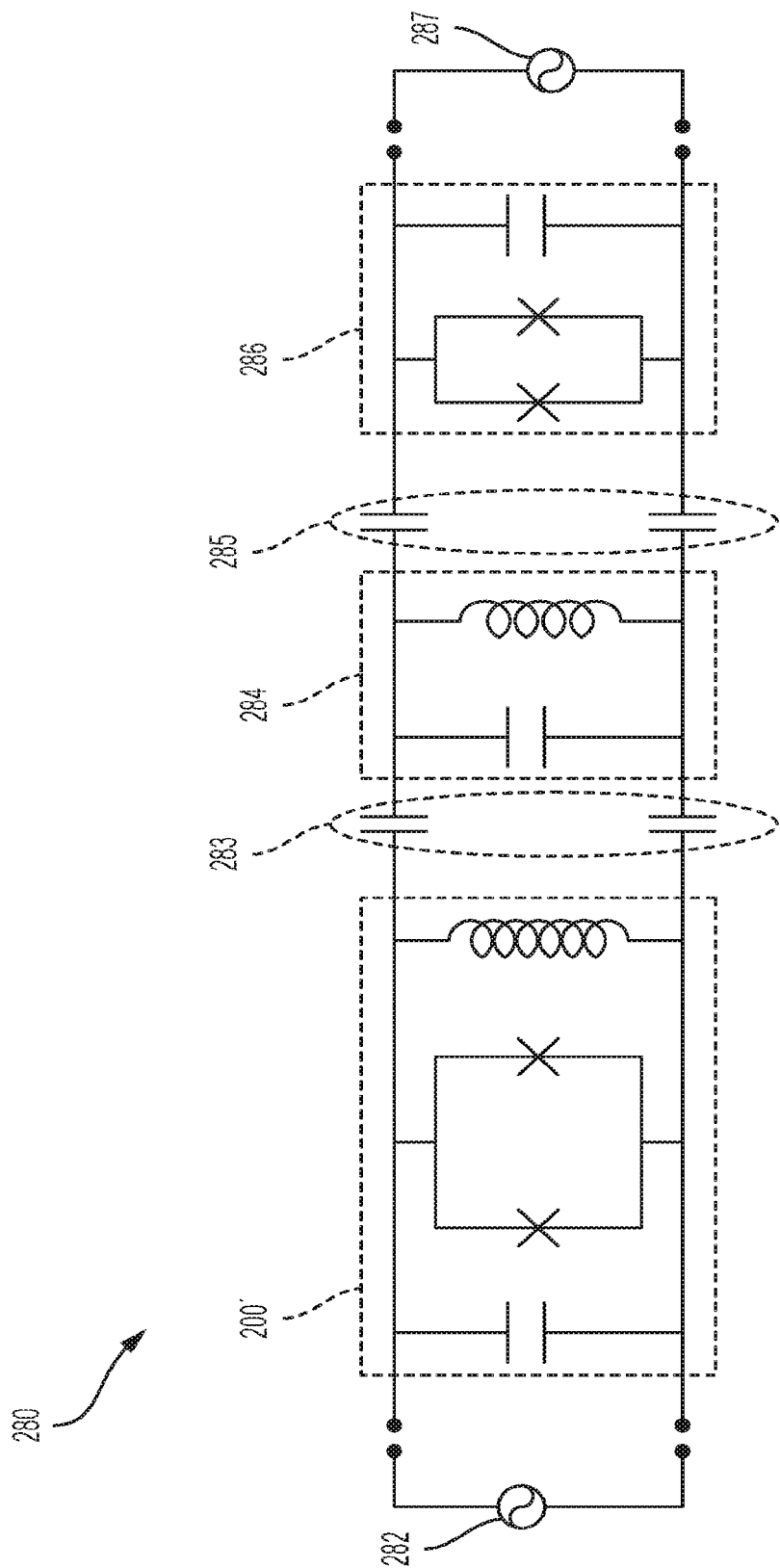
FIG. 2C shows an equivalent circuit for an example quantum integrated circuit.

FIG. 2C shows an equivalent circuit for an example quantum integrated circuit 280. The example quantum integrated circuit 280 can be included, for example, in the quantum circuit system 102 shown in FIG. 1 or in another type of quantum processor system. As shown in FIG. 2C, the example quantum integrated circuit 280 includes a qubit device 200', capacitors 283 and 285, a readout resonator 284 and a quantum limited amplifier 286. A quantum integrated circuit may include additional or different features. In some cases, the quantum integrated circuit 280 is a portion of a larger quantum integrated circuit that includes several (e.g., tens, hundreds, thousands) of qubit devices, readout resonators, quantum amplifiers and other circuit elements, for instance, in a lattice structure or another type of arrangement.

The example quantum integrated circuit 280 may be fabricated on a substrate (e.g., a sapphire substrate, a silicon substrate, etc.) that supports one or more layers of superconducting material (e.g., aluminum, niobium, etc.) and insulating materials (e.g., aluminum oxide). For example, Josephson junctions may be formed by a layer of aluminum oxide sandwiched between layers of aluminum superconducting material, connections between devices may be formed by superconducting wire (e.g., aluminum), etc.

As shown in FIG. 2C, the qubit device 200' is capacitively coupled to the readout resonator 284 by the capacitors 283, and the quantum limited amplifier 286 is capacitively coupled to the readout resonator 284 by the capacitors 285. The qubit device 200' is communicably coupled to a microwave source 282, and the quantum limited amplifier 286 is communicably coupled to a microwave source 287. In some implementations, the microwave sources 282, 287 are included in a control system (e.g., the control system 110 shown in FIG. 1 or another type of control system) that is external to the quantum integrated circuit 280. The control system may be communicably coupled to the quantum integrated circuit 280, for example, by a signal delivery system (e.g., the signal delivery system 106 shown in FIG. 1 or another type of signal delivery system), connectors (e.g., waveguides, coaxial cables, etc.) or other types of connection systems or devices.

The example qubit device 200' in FIG. 2C has the circuit topology of the example qubit device 200 shown in FIG. 2A. In some cases, the qubit device 200' in FIG. 2C may be implemented in another manner, for example, according to the circuit topology of the example qubit device 250 shown in FIG. 2B or otherwise. A flux bias device (not shown) may be inductively coupled to the qubit device 200' to provide a magnetic flux that tunes a resonance frequency of the qubit device 200'. The flux bias device may be included in the quantum integrated circuit 280 (e.g., on-chip with the circuit elements shown in FIG. 2C) or the flux bias device may be external to the quantum integrated circuit 280.

In some aspects of operation, the microwave source 282 sends microwave signals (e.g., control signals) to the qubit device 200', for example, to manipulate the quantum state of the qubit. For instance, the microwave source 282 may generate a microwave signal at the qubit frequency, and the microwave signal may be delivered to the qubit device 200' to drive a transition between the computational basis states of the qubit. The microwave signals may be configured to perform a single-qubit gate, a two-qubit gate, or another type of quantum computing operation.

In some aspects of operation, the microwave source 287 sends microwave signals to the readout resonator 284, for example, to detect the quantum state of the qubit device 200'. For instance, the readout resonator 284 can be probed by a microwave signal (e.g., a readout interrogation signal) that is generated by the microwave source 287 and delivered to the readout resonator 284 through the quantum limited amplifier 286 and the capacitors 285; and in response, the readout resonator 284 can produce a microwave signal (e.g., a readout response signal). The readout response signal can be produced by reflecting the readout interrogation signal with additional information. In some instances, the resonance frequency of the readout resonator 284 is influenced by the quantum state of the qubit device 200', and the properties of the readout response signal indicate a quantum state of the qubit device 200'. The additional information can be, for example, a frequency shift, a phase shift, an amplitude shift, or a combination of these and other modifications, that indicates the state of the qubit device 200'.

In some implementations, the quantum integrated circuit 280 includes additional qubit devices; the additional qubit devices may be the same as or similar to the example qubit devices 200, 250 shown in FIGS. 2A, 2B, or the additional qubit devices may include different types of qubit devices (e.g., flatsonium, transmon, fluxonium, or another type of qubit device). A flatsonium qubit device is a flux qubit device of the type described with respect to FIGS. 2A, 2B and 3B. A transmon qubit device is a charge qubit device that typically includes a single Josephson junction and a shunt capacitance. A fluxonium qubit device is a flux qubit device that typically includes a single Josephson junction, a shunt capacitance and a shunt inductance.

In some cases, the quantum integrated circuit 280 includes another qubit device (e.g., on the same substrate) that can be coupled to the example qubit device 200' shown in FIG. 2C, for example, to perform a two-qubit logic gate or another type of quantum logic operation. The other qubit device can be, for example, a flatsonium qubit, a transmon qubit, a fluxonium qubit or another type of qubit. In some instances, a two-qubit gate may be applied to the two qubits, for example, by tuning the qubit device 200' to a qubit frequency that is equal to (or near) the other qubit device's qubit frequency.

In some examples, a controlled two-qubit gate operation can be realized by tuning the qubit frequency of one qubit device towards the qubit frequency of the second qubit device. For instance, a SWAP gate between two qubits may be applied by first parking the first qubit at a frequency far (e.g., 1 GHz or more) from the second qubit's frequency, slowly tuning the first qubit to the second qubit's frequency, waiting for some time, and tuning the first qubit back to the parking frequency. For example, in some cases, an iSWAP gate (00→00, 01→i10, 10→i01, 11→11) can be realized by waiting for a time period t=π/2 g, where g is the coupling strength between the two qubits. Other classes of SWAP gates can be implemented by varying the waiting time. In some implementations, other types of controlled quantum logic gates can be implemented by tuning the frequency of the quit device.

FIGS. 3A and 3B show an example quantum integrated circuit 300. FIG. 3A shows a top view of a chip that includes a qubit device 306 and an on-chip flux bias device 308; FIG. 3B shows a zoomed-in view of the qubit device 306 and a portion of the nearby flux bias device 308. The example quantum integrated circuit 300 can be included, for example, in the quantum circuit system 102 shown in FIG. 1 or in another type of quantum processor system.

As shown in FIGS. 3A and 3B, the example quantum integrated circuit 300 is implemented on a chip that includes a substrate 301, signal ports 302 and 312, a readout resonator 304, the qubit device 306, the flux bias device 308 and a filter 310. The chip may include additional or different components or features. In some cases, the quantum integrated circuit 300 is implemented on a chip that includes additional circuit elements, for instance, an array of qubit devices and associated readout resonators and filters.

The example substrate 301 can be silicon, sapphire or another type of material. In some cases, a wafer is processed (e.g., by deposition, lithography, etching, and other fabrication processes), and the substrate 301 is cut from the processed wafer to form the chip structure shown in FIG. 3A. The devices on the substrate 301 can be formed by one or more layers of superconducting material (e.g., aluminum, niobium, etc.) and insulating materials (e.g., aluminum oxide). For example, Josephson junctions in the qubit device 306 may be formed by a layer of aluminum oxide sandwiched between layers of aluminum superconducting material; drive lines and other connectors, inductors and capacitor pads may be formed by superconducting material (e.g., aluminum) on the substrate 301; etc.

The example readout resonator 304 can be implemented as a lumped-element electromagnetic device having an LC characteristic that defines a resonance frequency. For instance, the readout resonator 304 may have a capacitance and inductance that define a resonance characteristic and that allow the readout resonator 304 to interact with the qubit device 306, for example, to detect the state of the qubit device 306. The example readout resonator 304 shown in FIG. 3A is a microwave resonator, having a microwave resonance frequency. The readout resonator 304 may include an inductance formed by a meander inductor, a spiral inductor, or an inductor having another shape integrated into a coplanar waveguide topology or microstrip topology. The readout resonator 304 may include a capacitance formed by one or more capacitive pads that at least partially surround the inductor.

The example signal port 302 can be connected to an another device or system, for example, to another device on the chip or to a system external to the chip. As shown in FIG. 3A, the signal port 302 is connected to a resonator drive line 303 that extends from the signal port 302 to a terminal end that is capacitively coupled to the readout resonator 304. Also shown in FIG. 3A, the readout resonator 304 is connected to the qubit device 306 by a qubit drive line 305 that extends between the readout resonator 304 and the qubit device 306. In the example shown, the signal port 302 and the resonator drive line 303 are configured to transfer microwave signals between the readout resonator 304 and an external control system, for example, through one or more intermediate systems or components; the signal port 302, the readout resonator 304, the resonator drive line 303 and the qubit drive line 305 are configured to transfer microwave signals between the qubit device 306 and the external control system, for example, through one or more intermediate systems or components.

In some instances, the signal port 302 receives a readout interrogation signal having a microwave frequency at or near the resonance frequency of the readout resonator 304. The resonator drive line 303 can transfer the readout interrogation signal to the readout resonator 304, and the readout resonator 304 can produce a readout response signal by reflecting the readout interrogation signal. The phase of the readout response signal can indicate the quantum state of qubit device 306. For example, the quantum state of the qubit device 306 may influence the impedance of the readout resonator 304 at the frequency of the readout interrogation signal.

In some instances, the signal port 302 receives a qubit drive signal having a microwave frequency at or near the qubit frequency of the qubit device 306. The resonator drive line 303, the readout resonator 304 and the qubit drive line 305 can transfer the qubit drive signal to the qubit device 306, and the qubit drive signal can drive the qubit device 306 at the qubit frequency. For instance, the qubit frequency may be shifted from (e.g., below or above) the resonance frequency of the readout resonator 304, and the readout resonator 304 may therefore pass the qubit drive signal from the resonator drive line 303 to the qubit drive line 305. The qubit drive signal can be configured to perform a single-qubit gate or another type of quantum logic operation on the qubit. For example, the quantum state of the qubit device 306 may be modified by the qubit drive signal.

The example filter 310 can be implemented as a filter device that suppresses or attenuates electromagnetic signals at or around the qubit frequency. For instance, the filter 310 may have an LC characteristic and that transfers low-frequency (e.g., direct current) signals between the signal port 312 and the flux bias device 308, for example, to control a magnetic field generated by the flux bias device 308. In some cases, the filter 310 can be implemented as a low-pass filter, a band-pass filter, or another type of filter. The filter 310 can be configured to suppress information leakage or other types of loss from the qubit device 306. The filter 310 may include an inductance formed by a meander inductor, a spiral inductor, or an inductor having another shape integrated into a coplanar waveguide topology or microstrip topology. The filter 310 may include a capacitance between the inductor and a ground plane.

The example signal port 312 can be connected to an another device or system, for example, another device on the chip or a system external to the chip. As shown in FIG. 3B, the signal port 312 is connected to a flux bias drive line 307 that extends from the signal port 312 and passes through the filter 310 to the flux bias device 308. In some instances, the signal port 312 and flux bias drive line 307 transfer direct-current signals between the flux bias device 308 and an external control system, for example, through one or more intermediate systems or components.

As shown in FIG. 3B, the example qubit device 306 includes a first Josephson junction 352A, a second Josephson junction 352B, an inductor 354 and connection lines 371A, 371B, 371C, 371D. The example qubit device 306 in FIG. 3B is an example implementation of the example qubit device 250 represented by the equivalent circuit in FIG. 2B. For example, the first Josephson junction 352A in FIG. 3B has the first inductance ($L_{J_1}$) and the first Josephson energy ($E_{J_1}$); the second Josephson junction 352B in FIG. 3B has the second inductance ($L_{J_2}$) and the second Josephson energy ($E_{J_2}$); the inductor 354 in FIG. 3B has the inductance $L_A$; and the Josephson junctions 352A, 352B have the parasitic capacitance $C_J$ shunted by the linear inductance ($L_A$) of the inductor 354.

In the example qubit device 306 represented in FIG. 3B, the inductor 354 is connected between two circuit nodes on either side of the second Josephson junction 352B; the first Josephson junction 352A is connected (via the connection lines 371A, 371B, 371C, 371D) in parallel with the inductor 354 between the two circuit nodes; and the second Josephson junction 352B is connected in parallel with the inductor 354 between the two circuit nodes. The circuit elements may be connected in another manner in some cases.

As shown in FIG. 3B, the example qubit device 306 includes two circuit loops—a first circuit loop that includes the first Josephson junction 352A and the inductor 354, and a second circuit loop that includes the second Josephson junction 352B and the inductor 354. Each of the circuit loops in qubit device 306 defines an interior area that can receive magnetic flux during operation of the qubit device 306. The first circuit loop defines a first magnetic flux area 360A at the boundaries of the connection lines 371A, 371B, 371C, 371D, the first Josephson junction 352A and the inductor 354. In particular, the perimeter of the first magnetic flux area 360A follows an outer boundary of the inductor 354 and an inner boundary of the connection lines 371A, 371B, 371C, 371D and the first Josephson junction 352A. The second circuit loop defines a second magnetic flux area 360B at the boundaries of the second Josephson junction 352B and the inductor 354. In particular, the perimeter of the second magnetic flux area 360B follows an inner boundary of the inductor 354 and an inner boundary of the second Josephson junction 352B. The qubit device 306 may include additional or different circuit loops, and the circuit loops may be configured in another manner in some cases.

As shown in FIG. 3B, the first magnetic flux area 360A and the second magnetic flux area 360B are exclusive areas on the substrate 301. For instance, the first magnetic flux area 360A does not contain any of the second magnetic flux area 360B, and vice versa. Although the first magnetic flux area 360A and the second magnetic flux area 360B share a boundary (the inductor 354), the first magnetic flux area 360A resides entirely outside the second magnetic flux area 360B in the example shown.

The magnetic flux received by the first and second magnetic flux areas 360A, 360B can define transition frequencies (including the qubit frequency) of the qubit device 306. In particular, the first magnetic flux area 360A can be the first interior area ($A'_1$, shown in FIG. 2B) that is configured to receive a first portion $\Phi'_{ext,1}$ of the external magnetic flux; and the second magnetic flux area 360B can be the second interior area ($A'_2$, shown in FIG. 2B) configured to receive a second portion $\Phi'_{ext,2}$ of the external magnetic flux. In some cases, the qubit device 306 shown in FIG. 3B may be configured and operated as described with respect to the qubit devices 200, 250 shown in FIGS. 2A, 2B respectively. For instance, the Josephson energy ratio ($r_{JE}$) of the qubit device 306 and the magnetic flux ratio ($r_{\Phi'}$) of the qubit device 306 can have the values or the relationships (or both) as described with respect to FIG. 2B.

The example flux bias device 308 can be implemented as a coil that can produce a magnetic field in the first and second magnetic flux areas 360A, 360B. Accordingly, the magnetic field generated by the flux bias device 308 contributes to the magnetic flux in the first and second magnetic flux areas 360A, 360B during operation. In some instances, the magnetic field produced by the flux bias device 308 varies over the spatial extent of the qubit device 306. In some cases, the flux bias device 308 receives a direct current (or other low-frequency) bias signal that causes the flux bias device to generate a constant (or slowly varying) magnetic field. The DC bias signal can be changed, for instance, to control the strength of the external magnetic field experienced by the qubit device 306. For instance, the magnetic flux received by the first and second magnetic flux areas 360A, 360B can be set at least partially by the DC bias signal.

FIG. 4 is a plot 400 showing transition frequencies as a function of external magnetic flux for an example qubit device. To compute the transition frequencies shown in FIG. 4, the example qubit device 200 represented by the equivalent circuit in FIG. 2A was numerically modeled on a classical computer. The classical Lagrangian for the modeled qubit device can be expressed $$\mathcal{L} = \frac{1}{2}C_J\Phi^2 + E_{J_1}\cos\left(\frac{2\pi\Phi}{\Phi_0}\right) + E_{J_2}\cos\left[\frac{2\pi}{\Phi_0}(\Phi + \Phi_{ext,1})\right] - \frac{1}{2}E_L\left[\frac{2\pi}{\Phi_0}(\Phi + \Phi_{ext,2})\right]^2$$

Here, $\Phi$ represents the node flux at the first circuit node 212A in the example qubit device represented in FIG. 2A; $\Phi_0$ represents a flux quantum. Introducing a new variable, $$\varphi = \frac{2\pi}{\Phi_0}(\Phi + \Phi_{ext,2}),$$

the corresponding Hamiltonian has the form $$H = \frac{Q^2}{2C_J} - E_{J_1}\cos\left(\varphi - \frac{2\pi\Phi_{ext,2}}{\Phi_0}\right) - E_{J_2}\cos\left(\varphi - 2\pi\frac{\Phi_{ext,2} - \Phi_{ext,1}}{\Phi_0}\right) - \frac{1}{2}E_L\varphi^2.$$

Expressing the total charge as the net number of Cooper pairs that tunneled through the junctions, $Q=2en$ (where e represents the electron charge) we have $$\frac{\hat{Q}^2}{2C_J} = 4E_C\hat{n}^2.$$

Noting that the number of Cooper pairs $\hat{n}$ and the phase $\hat{\varphi}$ are conjugate variables, we can write the quantized Hamiltonian as $$H = 4E_C\hat{n}^2 - E_{J_1}\cos\left(\hat{\varphi} - \frac{2\pi\Phi_{ext,2}}{\Phi_0}\right) - E_{J_2}\cos\left(\hat{\varphi} - 2\pi\frac{\Phi_{ext,2} - \Phi_{ext,1}}{\Phi_0}\right) + \frac{1}{2}E_L\hat{\varphi}^2.$$

To generate the plot 400 shown in FIG. 4, the qubit device was modeled with a global magnetic field applied, where the fluxes $\Phi_{ext,1}$ and $\Phi_{ext,2}$ are related to their respective loop areas. In this example, the magnetic fluxes are related by the magnetic flux ratio as $\Phi_{ext,1}=r_\Phi\Phi_{ext,2}$. In view of this, the Hamiltonian now takes the form $$H = 4E_C\hat{n}^2 - E_{J_1}\cos\left(\hat{\varphi} - \frac{2\pi\Phi_{ext,2}}{\Phi_0}\right) - E_{J_2}\cos\left(\hat{\varphi} - (1-r_\Phi)\frac{2\pi\Phi_{ext,2}}{\Phi_0}\right) + \frac{1}{2}E_L\hat{\varphi}^2.$$

In the numerical model used to generate the plot 400, the following example values were chosen for the circuit parameters:

$$\frac{E_{J_1}}{E_{J_2}} = 3,$$

$$E_{J_1} = \frac{1}{L_{J_1}}\left(\frac{\Phi_0}{2\pi}\right)^2 = 3 \text{ GHz},$$

$$E_{J_2} = \frac{1}{L_{J_2}}\left(\frac{\Phi_0}{2\pi}\right)^2 = 9 \text{ GHz},$$

$$E_L = \frac{1}{L_A}\left(\frac{\Phi_0}{2\pi}\right)^2 = 0.45 \text{ GHz},$$

$$E_C = \frac{e^2}{2C_J} = 3 \text{ GHz},$$

$$r_\Phi = 4.$$

Here, $E_L$ represents the energy of the inductor 204, and $E_C$ represents the charging energy of the capacitor 208. The Hamiltonian shown above can be numerically diagonalized to compute the energy spectrum shown in FIG. 4.

The plot 400 includes a horizontal axis 402 representing a range of values for the external magnetic flux $\Phi_{ext,\,2}$ in units of flux quanta $\Phi_0$. The plot 400 includes a vertical axis 404 representing a range of values for the plotted transition frequencies $f_{01}$, $f_{02}$, $f_{03}$ in units of gigahertz (GHz). A first curve 406A in the plot 400 represents the transition frequency $f_{01}$, which is the frequency associated with the transition between the ground state and first excited state of the qubit device; a second curve 406B in the plot 400 represents the transition frequency $f_{02}$, which is the frequency associated with the transition between the ground state and second excited state of the qubit device; and a third curve 406C in the plot 400 represents the transition frequency $f_{03}$, which is the frequency associated with the transition between the ground state and third excited state of the qubit device. The large gap between the first curve 406A and the second curve 406B in the plot 400 (between the first and second transition frequencies $f_{01}$, $f_{02}$) shows that the qubit device is strongly anharmonic.

The qubit device may be operated with the ground state and first excited states representing the computational basis states of a qubit. In such cases, the first transition frequency $f_{01}$ (shown as the first curve 406A) represents the qubit frequency. As shown in FIG. 4, the qubit frequency has multiple flux sweet spots. The example flux sweet spots 408A, 408B, 408C, 408D labeled in FIG. 4 are locations where the first curve 406A has an inflection point (first derivative equal to zero) between the local maxima and minima of the first curve 406A. In particular, in the range of external flux shown in FIG. 4 (minus one to plus one flux quantum), the first curve 406A has a maximum value near 7.5 GHz at three locations (at $\Phi_{ext,\,2}/\Phi_0=\{-1,0,1\}$); the first curve 406A has a minimum value near 0.1 GHz at two locations (at $\Phi_{ext,\,2}/\Phi_0=\{-0.5, 0.5\}$); and the first curve 406A has four other inflection points between the maximum and minimum values. The four other inflection points indicate flux sweet spots in the qubit frequency near 4.0 GHz at four flux points (at $\Phi_{ext,\,2}/\Phi_0=\{-0.75, -0.25, 0.25, 0.75\}$). As shown in FIG. 4, the total number of flux sweet spots over a single flux quantum (e.g., at $\{0.00, 0.25, 0.50, 0.75\}$ in the flux quantum from $\Phi_{ext,\,2}=[0, \Phi_0]$ in the plot) equals the magnetic flux ratio $r_\Phi=4$.

When the qubit device is operated with its qubit frequency tuned to one of the flux sweet spots 408A, 408B, 408C, 408D, the characteristic dephasing time of the qubit device can approach the limits set by dissipation in the system. Moreover, the qubit frequency demonstrates a characteristic linear magnetic flux dependence away from the flux sweet spots 408A, 408B, 408C, 408D, which can be useful for performing logic gates or applying other operations to the qubit device in some cases.

Figure 5A:
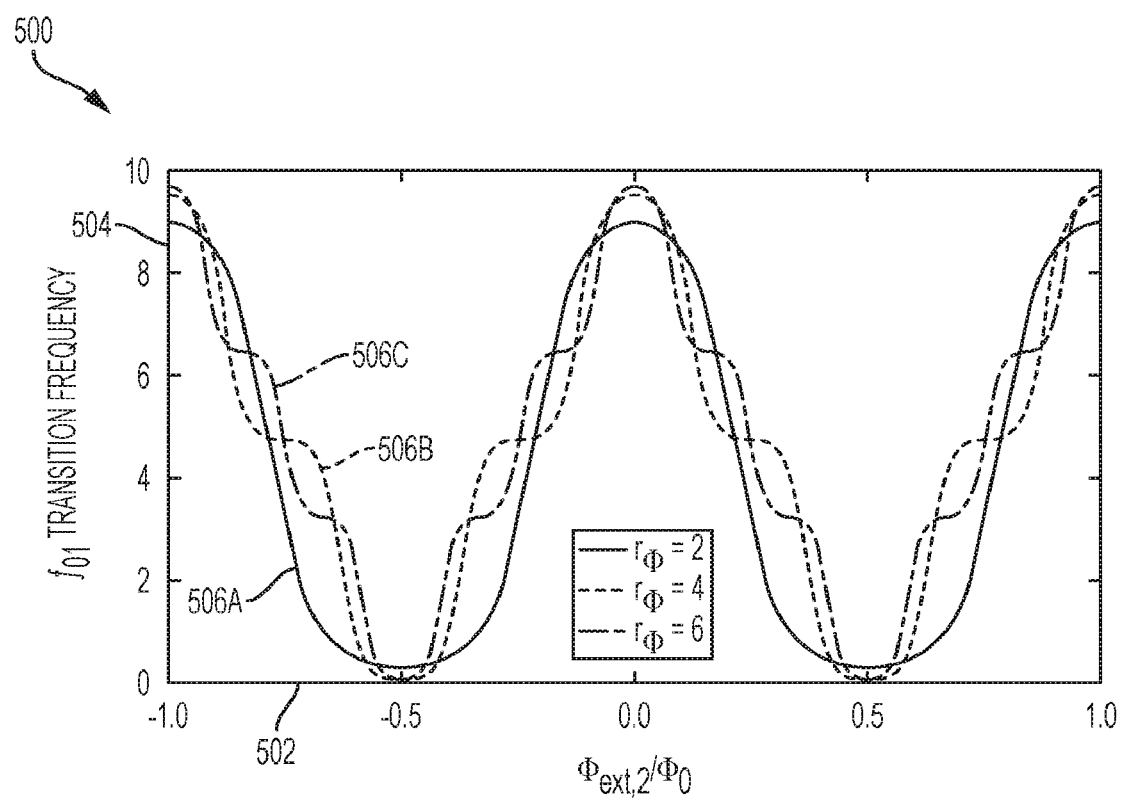
FIGS. 5A and 5B are plots showing transition frequencies as a function of external magnetic flux for example qubit devices.
Figure 5B:
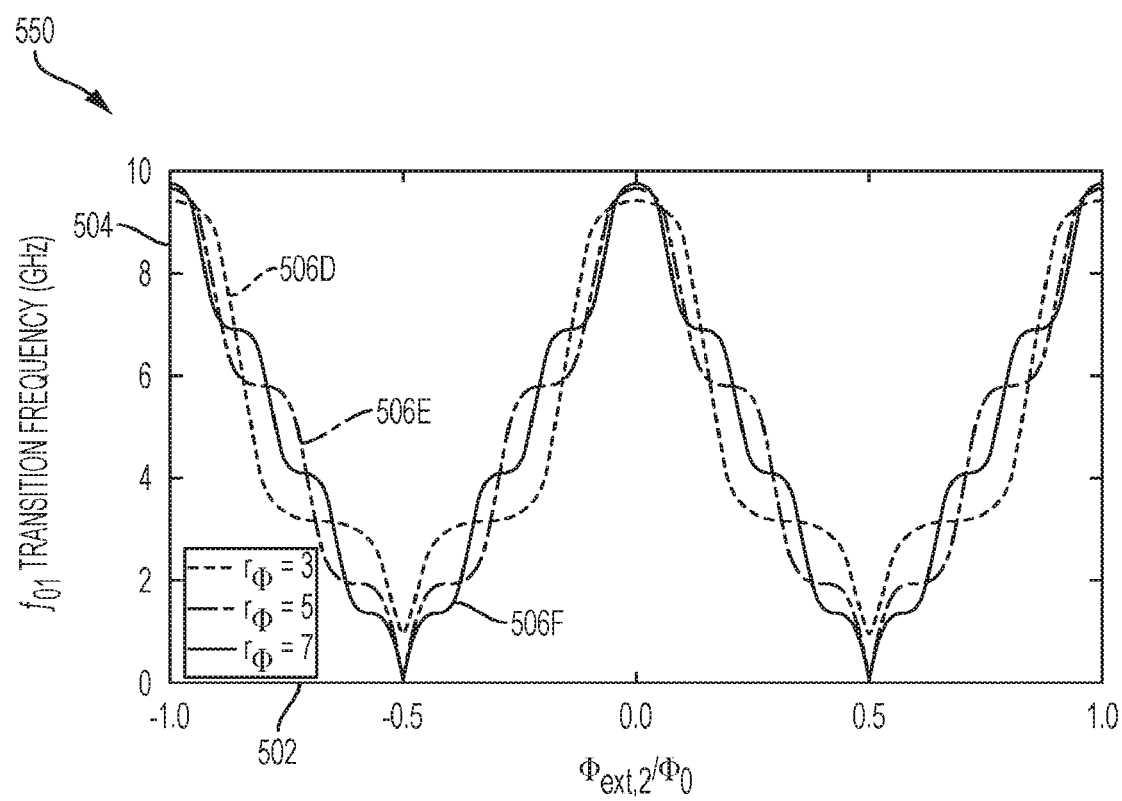

FIGS. 5A and 5B are plots 500, 550 showing transition frequencies as a function of external magnetic flux for example qubit devices. Each of the curves plotted in FIGS. 5A and 5B represents a qubit device having a distinct value of the magnetic flux ratio $r_\Phi$. In the examples shown, the maximum frequency for each curve is determined by the inductance energy $E_L$, while the frequencies at which the flux sweet spots appear are controlled by the asymmetry of the two Josephson junctions.

The plots 500, 550 each include a horizontal axis 502 representing a range of values for the external magnetic flux $\Phi_{ext,\,2}$ in units of flux quanta $\Phi_0$. The plots 500, 550 each include a vertical axis 504 representing a range of values for the first transition frequency $f_{01}$ for each qubit device in units of gigahertz (GHz). Here, the first transition frequency $f_{01}$ represents the qubit frequency.

In FIG. 5A, a first curve 506A in the plot 500 represents the qubit frequency for a qubit device having a magnetic flux ratio $r_\Phi=2$, which has two flux sweet spots over one flux quantum (e.g., at $\{0.00, 0.50\}$ in the flux quantum from $\Phi_{ext,\,2}/\Phi_0=[0, 1]$ in the plot). A second curve 506B in the plot 500 represents the qubit frequency for a qubit device having a magnetic flux ratio $r_e=4$, which has four flux sweet spots over one flux quantum (e.g., at $\{0.00, 0.25, 0.50, 0.75\}$ in the flux quantum from $\Phi_{ext,\,2}/\Phi_0=[0, 1]$ in the plot). A third curve 506C in the plot 500 represents the qubit frequency for a qubit device having a magnetic flux ratio $r_e=6$, which has six flux sweet spots over one flux quantum (e.g., at $\{0.00, 0.17, 0.33, 0.50, 0.67, 0.83\}$ in the flux quantum from $\Phi_{ext,\,2}/\Phi_0=[0, 1]$ in the plot).

In FIG. 5B, a fourth curve 506D in the plot 550 represents the qubit frequency for a qubit device having a magnetic flux ratio $r_e=3$, which has four flux sweet spots over one flux quantum (e.g., at $\{0.00, 0.25, 0.50, 0.75\}$ in the flux quantum from $\Phi_{ext,\,2}/\Phi_0=[0, 1]$ in the plot). A fifth curve 506E in the plot 550 represents the qubit frequency for a qubit device having a magnetic flux ratio $r_e=5$, which has six flux sweet spots over one flux quantum (e.g., at $\{0.00, 0.17, 0.33, 0.50, 0.67, 0.83\}$ in the flux quantum from $\Phi_{ext,\,2}/\Phi_0=[0, 1]$ in the plot). A sixth curve 506F in the plot 550 represents the qubit frequency for a qubit device having a magnetic flux ratio $r_e=7$, which has eight flux sweet spots over one flux quantum (e.g., at $\{0.125, 0.25, 0.375, 0.50, 0.625, 0.75, 0.875\}$ in the flux quantum from $\Phi_{ext,\,2}/\Phi_0=[0, 1]$ in the plot).

In the examples shown in FIGS. 5A and 5B, the number of flux sweet spots is related to the ratio of the magnetic fluxes ($r_\Phi$). For instance, in the examples shown, the number $n_{sp}$ of sweet spots is given by $$n_{sp} = \begin{cases} r_\Phi, & \text{for even } r, \\ r_\Phi + 1, & \text{for odd } r. \end{cases}$$

The number of sweet spots may have another value in some cases.

Figure 6:
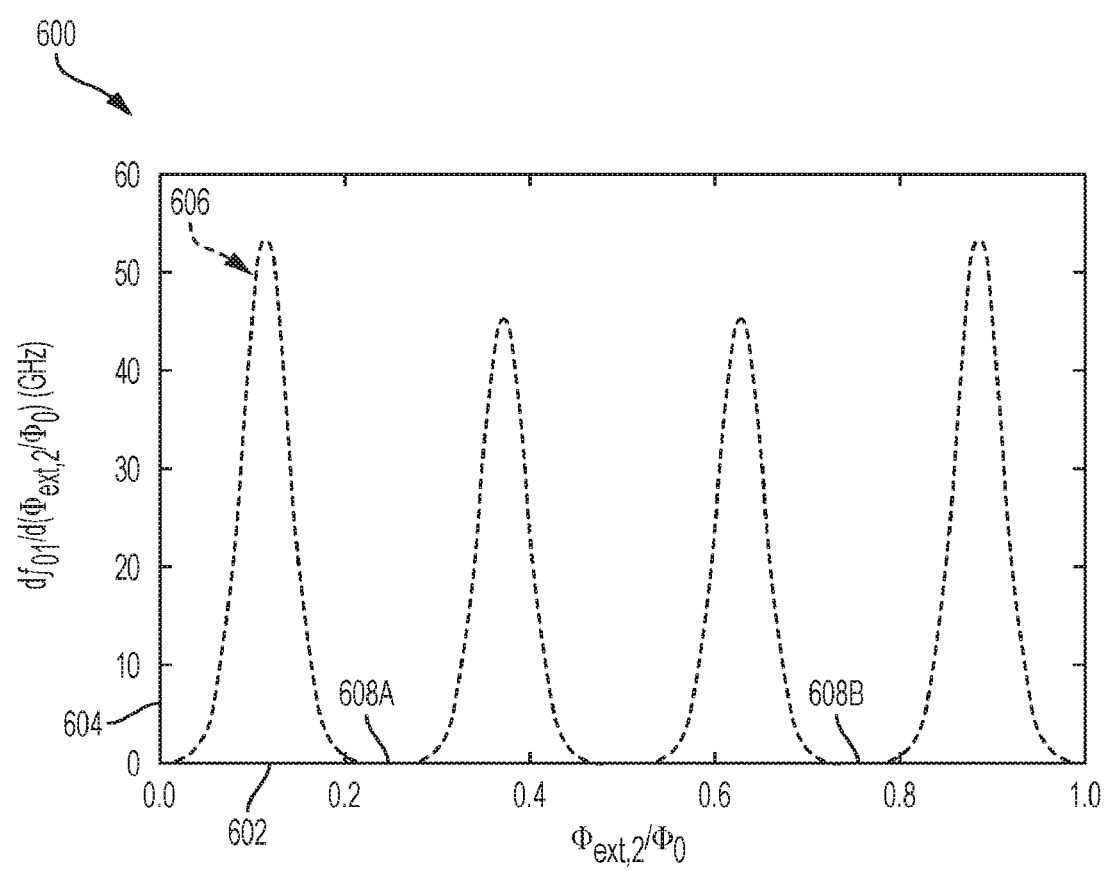
FIG. 6 is a plot showing the derivative of a transition frequency as a function of external magnetic flux for an example qubit device.

FIG. 6 is a plot 600 showing the derivative of a transition frequency as a function of external magnetic flux for an example qubit device. The plot 600 includes a horizontal axis 602 representing a range of values for the external magnetic flux $\Phi_{ext,\,2}$ in units of flux quanta $\Phi_0$. The plot 600 includes a vertical axis 604 representing a range of values for the derivative of the first transition frequency $f_{01}$ (in units of GHz) with respect to the external magnetic flux $\Phi_{ext,2}$ (in units of flux quanta $\Phi_0$).

To compute the values represented by the curve 606 shown in FIG. 6, the example qubit device 200 represented by the equivalent circuit in FIG. 2A was numerically modeled on a classical computer. In the numerical model used to generate the plot 600, the following example values were chosen for the circuit parameters:

$$\frac{E_{J_1}}{E_{J_2}} = 3,$$

$$E_{J_1} = \frac{1}{L_{J_1}}\left(\frac{\Phi_0}{2\pi}\right)^2 = 3 \text{ GHz},$$

$$E_{J_2} = \frac{1}{L_{J_2}}\left(\frac{\Phi_0}{2\pi}\right)^2 = 9 \text{ GHz},$$

$$E_L = \frac{1}{L_A}\left(\frac{\Phi_0}{2\pi}\right)^2 = 0.45 \text{ GHz},$$

$$E_C = \frac{e^2}{2C_J} = 3 \text{ GHz},$$

$$r_\Phi = 4.$$

In the example shown in FIG. 6, the first derivative of the qubit frequency is zero at the engineered flux sweet spots. As shown, the flux sweet spots have a finite bandwidth, which allows the qubit frequency to be parked at a flux sweet spot while other qubit operations (e.g., qubit readout, single and two qubit gates) are performed.

In a general aspect of the examples described here, a quantum integrated circuit includes multiple circuit loops.

In a first example, a qubit device includes an inductor connected between a first circuit node and a second circuit node; a first Josephson junction connected in parallel with the inductor between the first circuit node and the second circuit node; and a second Josephson junction connected in parallel with the inductor between the first circuit node and the second circuit node.

In a second example, a quantum computing method includes operating a qubit device. The qubit device includes an inductor connected between a first circuit node and a second circuit node; a first Josephson junction connected in parallel with the inductor between the first circuit node and the second circuit node; and a second Josephson junction connected in parallel with the inductor between the first circuit node and the second circuit node.

Implementations of the first or second example may include one or more of the following features. The qubit device can include a first circuit loop that includes the first Josephson junction; and a second circuit loop that includes the second Josephson junction. The first and second circuit loops can be configured to receive, during operation of the qubit device, a magnetic flux that defines a transition frequency of the qubit device.

Implementations of the first or second example may include one or more of the following features. The first circuit loop can include the first Josephson junction and the second Josephson junction; and the second circuit loop can include the inductor and the second Josephson junction. The first circuit loop can include the first Josephson junction and the inductor; and the second circuit loop can include the second Josephson junction and the inductor.

Implementations of the first or second example may include one or more of the following features. The first Josephson junction can have a first Josephson energy; the second Josephson junction can have a second Josephson energy. The first and second Josephson energies can be unequal (e.g., substantially different values). A ratio of the first Josephson energy to the second Josephson energy can be substantially an integer value (e.g., within ±0.10 of an integer value). The first circuit loop can define a first magnetic flux area to receive a first portion of the magnetic flux; the second circuit loop can define a second magnetic flux area to receive a second portion of the magnetic flux. The first and second portions of the magnetic flux can be unequal (e.g., substantially different values). A ratio of the first portion of the magnetic flux to the second portion of the magnetic flux can be substantially an integer value (e.g., within ±0.10 of an integer value).

Implementations of the first or second example may include one or more of the following features. The first Josephson junction can have a first Josephson energy; the second Josephson junction can have a second Josephson energy; the first circuit loop can define a first magnetic flux area to receive a first portion of the magnetic flux; the second circuit loop can define a second magnetic flux area to receive a second portion of the magnetic flux; and the qubit device can be configured such that a Josephson energy ratio of the qubit device substantially equals (e.g., within ±0.10) a magnetic flux ratio of the qubit device minus one. The magnetic flux ratio can be the ratio of the first portion of the magnetic flux to the second portion of the magnetic flux, and the Josephson energy ratio can be the ratio of the first Josephson energy to the second Josephson energy. The magnetic flux ratio can be the ratio of the second portion of the magnetic flux to the first portion of the magnetic flux, and the Josephson energy ratio can be the ratio of the first Josephson energy to the second Josephson energy.

Implementations of the first or second example may include one or more of the following features. The transition frequency as a function of the magnetic flux can include a minimum, a maximum, and a flux sweet spot between the minimum and maximum.

Implementations of the first or second example may include one or more of the following features. The first Josephson junction and the second Josephson junction can each include a respective parasitic capacitance in parallel with the inductor. The inductor can be a superinductor that includes a serial array of Josephson junctions. The inductor can be a superinductor that includes a superconducting wire.

Implementations of the first or second example may include one or more of the following features. Operating the qubit device can include controlling a magnetic flux received by first and second circuit loops of the qubit device, where the first circuit loop includes the first Josephson junction, and the second circuit loop includes the second Josephson junction. Controlling the magnetic flux can tune a transition frequency of the qubit device.

Implementations of the first or second example may include one or more of the following features. Controlling the magnetic flux can include tuning the transition frequency of the qubit device to a flux sweet spot. Operating the qubit device can include performing a readout of the qubit device while the transition frequency is tuned to the flux sweet spot. Controlling the magnetic flux can include tuning the transition frequency away from a flux sweet spot. Operating the qubit device can include applying a logic gate to the qubit device while the transition frequency is tuned away from the flux sweet spot.

In a third example, a quantum integrated circuit includes a first circuit loop and a second circuit loop. The first circuit loop defines a first magnetic flux area configured to receive a first magnetic flux during operation of the quantum integrated circuit. The first circuit loop includes a first Josephson junction having a first Josephson energy. The second circuit loop defines a second magnetic flux area configured to receive a second magnetic flux during operation of the quantum integrated circuit. The second circuit loop includes a second Josephson junction having a second Josephson energy. The second Josephson junction is connected in parallel with the first Josephson junction. Either or both of the first circuit loop and the second circuit loop include an additional circuit element that is connected in parallel with the first Josephson junction and the second Josephson junction.

Implementations of the third example may include one or more of the following features. A Josephson energy ratio of the first and second circuit loops can substantially equal a magnetic flux ratio of the first and second circuit loops minus one. The Josephson energy ratio can be the ratio of the first Josephson energy to the second Josephson energy, and the magnetic flux ratio can be either the ratio of the first magnetic flux area to the second magnetic flux area or the ratio of the second magnetic flux area to the first magnetic flux area.

Implementations of the third example may include one or more of the following features. The magnetic flux received by the first and second circuit loops can define a transition frequency between energy states in the quantum integrated circuit.

Implementations of the third example may include one or more of the following features. The first circuit loop can include the first Josephson junction and the second Josephson junction; and the second circuit loop can include the additional circuit element and the second Josephson junction. The first circuit loop can include the first Josephson junction and the additional circuit element; and the second circuit loop can include the second Josephson junction and the additional circuit element.

Implementations of the third example may include one or more of the following features. A ratio of the first Josephson energy to the second Josephson energy can be substantially an integer value. A ratio of the first magnetic flux to the second magnetic flux can be substantially an integer value.

Implementations of the third example may include one or more of the following features. The quantum integrated circuit can include a qubit device. The qubit device can include the first Josephson junction, the second Josephson junction and the additional circuit element, and the additional circuit element can include an inductor.

Implementations of the third example may include one or more of the following features. The quantum integrated circuit can include a microwave resonator device capacitively coupled to the qubit device. The microwave resonator device can reside on a chip with the qubit device. The quantum integrated circuit can include a flux bias device that resides on a chip with the qubit device. The flux bias device can be configured to generate a magnetic field that contributes to the first magnetic flux and the second magnetic flux during operation of the quantum integrated circuit.

In a fourth example, a quantum computing system includes a qubit device. The qubit device includes a first superconducting quantum interference device (SQUID) loop and a second SQUID loop. The first and second SQUID loops are configured to receive a magnetic flux that defines a transition frequency of the qubit device.

Implementations of the fourth example may include one or more of the following features. The first and second SQUID loops can be configured such that the transition frequency as a function of the magnetic flux has a maximum, a minimum and a flux sweet spot between the maximum and the minimum.

Implementations of the fourth example may include one or more of the following features. The first SQUID loop can include a first Josephson junction, the second SQUID loop can include a second Josephson junction and the first SQUID loop or the second SQUID loop (or both) can include a superinductor. The first SQUID loop can include the first Josephson junction and the second Josephson junction, and the second SQUID loop can include the superinductor and the second Josephson junction. The first SQUID loop can include the first Josephson junction and the superinductor, and the second SQUID loop can include the second Josephson junction and the superinductor.

Implementations of the fourth example may include one or more of the following features. The first Josephson junction can have a first Josephson energy; the second Josephson junction can have a second Josephson energy; the first SQUID loop can define a first magnetic flux area to receive a first portion of the magnetic flux; and the second SQUID loop can define a second magnetic flux area to receive a second portion of the magnetic flux. The qubit device can be configured such that a Josephson energy ratio of the qubit device substantially equals a magnetic flux ratio of the qubit device minus one. The magnetic flux ratio can be the ratio of the first portion of the magnetic flux to the second portion of the magnetic flux, and the Josephson energy ratio can be the ratio of the first Josephson energy to the second Josephson energy.

Implementations of the fourth example may include one or more of the following features. The quantum computing system can include a chip that supports the qubit device and a readout resonator coupled to the qubit device. The quantum computing system can include a quantum circuit system that houses the qubit device, and a signal delivery system connected to the quantum circuit system. The signal delivery system can be configured to communicate signals between the quantum circuit system and a control system.

In a fifth example, a system of integrated microwave quantum circuits includes multiple tunable circuit elements for the cancellation of noise. In some cases, the tunable elements control the frequency response of a circuit. In some cases, the tunable elements control the coupling strength between devices. The tunable elements may be implemented, for example, as Superconducting Quantum Interference Devices (SQUID) loops. In some cases, the SQUID loop areas are related as integer multiples. In some cases, the Josephson energies are related as integer multiples. The SQUID loops can have shared degrees of freedom, for example, a common applied magnetic field. The flux through the SQUID loops can be independently controlled. An operating bias can achieve a response function to flux that is approximately zero.

In a sixth example, a quantum integrated circuit includes a superinductance, a first superconducting loop, and a second superconducting loop, where the second loop is in a branch of the first loop. In some cases, the area of the first loop is an integer multiple of the area of the second loop. In some cases, the superinductance is disposed in a branch of the first loop. The first loop, the second loop or both may include a plurality of Josephson junctions. The superinductance may be formed by a serial array of Josephson junctions, a high-kinetic inductance superconducting wire or another type of structure. The respective Josephson energies of the Josephson junctions can be related as integer multiples. In some cases, multiple of such quantum integrated circuits are implemented with multiple superconducting microwave resonators on a single chip.

In a seventh example, a quantum integrated circuit includes circuit loops and a superinductance that can be operated at a flux bias point where a transition frequency of the circuit is insensitive to magnetic flux noise. In some instances, a two-qubit gate is performed by applying an external magnetic field through the circuit loops to tune an operating frequency away from the magnetic flux insensitivity point. In some instances, qubit readout is performed at a flux bias point where the device is insensitive to magnetic flux noise.

In an eighth example, a quantum computing device includes a qubit device that includes an asymmetric SQUID and a large inductor. In some cases, the loop areas formed by the large inductor and Josephson junctions are in integer relation to one another. In some cases, the Josephson energy of the two junctions in the asymmetric SQUID are in integer relation to one another. The qubit device can be capacitively coupled to a linear microwave resonator. The qubit device can be capacitively coupled to a plurality of other qubit devices.

Implementations of the eighth example may include one or more of the following features. The qubit device can be controlled with a single on-chip flux bias device. The qubit device can be controlled with a plurality of on-chip flux bias devices. The qubit device can be controlled with an externally applied oscillating electric field. The qubit device can be measured with an externally applied oscillating field. The qubit device can be operated at a flux insensitive point. The qubit device can be operated at a flux-sensitive point. A two-qubit gate procedure can be implemented between the qubit device and a another superconducting qubit device.

In some examples, a quantum processor can be implemented based on an array of flux-insensitive qubit devices, such as, for example, the qubit devices described above. In some examples, a quantum processor can be implemented based on an array of flux-insensitive qubit devices and charge-insensitive qubit devices (e.g., transmon qubit devices). In some examples, a quantum processor can be implemented based on an array of flux-insensitive qubit devices and readout resonators. In some cases, nearest neighbors are capacitively coupled. In some cases, nearest neighbors are inductively coupled.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A quantum computing method for-operating a quantum circuit system comprising a first qubit device and a second qubit device, the first qubit device comprising:
   an inductor connected between a first circuit node and a second circuit node;
   a first Josephson junction connected in parallel with the inductor between the first circuit node and the second circuit node; and
   a second Josephson junction connected in parallel with the inductor between the first circuit node and the second circuit node,
   the method comprising applying a quantum logic gate to a pair of qubits defined by the first and second qubit devices, wherein applying the quantum logic gate comprises:
      parking a qubit frequency of the first qubit device at a parking frequency 1 GHz or more from a qubit frequency of the second qubit device;
      tuning the qubit frequency of the first qubit device towards the qubit frequency of the second qubit device;
      allowing a coupling of the first and second qubit devices to evolve for a predetermined time period; and
      tuning the qubit frequency of the first qubit device back to the parking frequency.

2. A quantum computing system comprising:
   a quantum circuit system comprising:
      a first qubit device comprising a first superconducting quantum interference device (SQUID) loop and a second SQUID loop, wherein the first and second SQUID loops are configured to receive a magnetic flux that defines a qubit frequency of the first qubit device; and
      a second qubit device; and
   a control system communicably coupled to the quantum circuit system, the control system configured to apply a quantum logic gate to a pair of qubits defined by the first and second qubit devices, wherein applying the quantum logic gate comprises:
      parking a qubit frequency of the first qubit device at a parking frequency 1 GHz or more from a qubit frequency of the second qubit device;
      tuning the qubit frequency of the first qubit device towards the qubit frequency of the second qubit device;
      allowing a coupling of the first and second qubit devices to evolve for a predetermined time period; and
      tuning the qubit frequency of the first qubit device back to the parking frequency.

3. The quantum computing system of claim 2, wherein the first and second SQUID loops are configured such that the qubit frequency of the first qubit device as a function of the magnetic flux comprises a maximum, a minimum and a flux sweet spot between the maximum and the minimum.

4. The quantum computing system of claim 2, comprising a chip that includes the first qubit device and a readout resonator coupled to the first qubit device.

5. The quantum computing system of claim 2, wherein the first SQUID loop include a first Josephson junction, the second SQUID loop includes a second Josephson junction and at least one of the first SQUID loop or the second SQUID loop includes a superinductor.

6. The quantum computing system of claim 5, wherein:
   the first SQUID loop includes the first Josephson junction and the second Josephson junction; and
   the second SQUID loop includes the superinductor and the second Josephson junction.

7. The quantum computing system of claim 5, wherein:
   the first SQUID loop includes the first Josephson junction and the superinductor; and
   the second SQUID loop includes the second Josephson junction and the superinductor.

8. The quantum computing system of claim 2, comprising:
a signal delivery system connected to the quantum circuit system and configured to communicate signals between the quantum circuit system and the control system.

9. The quantum computing system of claim 2, wherein the quantum logic gate is a SWAP gate.

10. The quantum computing method of claim 9, wherein the SWAP gate is an iSWAP gate, the predetermined time period (t) and a coupling strength (g) between the first and second qubit devices are related such that $t=\pi/2\,g$.

11. The quantum computing method of claim 1, wherein the quantum logic gate is a SWAP gate.

12. The quantum computing method of claim 11, wherein the SWAP gate is an iSWAP gate, the predetermined time period (t) and a coupling strength (g) between the first and second qubit devices are related such that $t=\pi/2\,g$.

13. The quantum computing method of claim 1, wherein the first qubit device comprises a first flatsonium qubit device, the second qubit device comprises a second flatsonium qubit device, and applying the quantum logic gate comprises operating the first flatsonium qubit device and the second flatsonium qubit device.

14. The quantum computing method of claim 1, wherein the first qubit device comprises a flatsonium qubit device, the second qubit device comprises a transmon qubit device, and applying the quantum logic gate comprises operating the flatsonium qubit device and the transmon qubit device.

15. The quantum computing method of claim 1, wherein the first qubit device comprises a flatsonium qubit device, the second qubit device comprises a fluxonium qubit device, and applying the quantum logic gate comprises operating the flatsonium qubit device and the fluxonium qubit device.

* * * * *

UNITED STATES PATENT AND TRADEMARK OFFICE
CERTIFICATE OF CORRECTION

PATENT NO. : 11,070,210 B2
APPLICATION NO. : 16/783603
DATED : July 20, 2021
INVENTOR(S) : Matthew J. Reagor et al.

It is certified that error appears in the above-identified patent and that said Letters Patent is hereby corrected as shown below:

In the Specification

Column 2, Line 44, Delete "FIG." and insert -- FIGS. -- therefor

Column 4, Line 11, After "scale of", insert -- $T_1$. -- therefor

Column 10, Line 33, Delete "($\Phi_{ext,1}$)$\Phi_{ext,2}$)" and insert -- ($\Phi_{ext,1}$, $\Phi_{ext,2}$) -- therefor Column 12, Line 6, Delete "$\Phi'_{ext2}$" and insert -- $\Phi'_{ext,2}$ -- therefor Column 20, Line 27, Delete "$r_e$=4," and insert -- $r_\phi = 4$, -- therefor Column 20, Line 31, Delete "$r_e$=6," and insert -- $r_\phi = 6$, -- therefor Column 20, Line 38, Delete "$r_e$=3," and insert -- $r_\phi = 3$, -- therefor Column 20, Line 42, Delete "$r_e$=5," and insert -- $r_\phi = 5$, -- therefor Column 20, Line 47, Delete "$r_e$=7," and insert -- $r_\phi = 7$, -- therefor Signed and Sealed this
Fifth Day of October, 2021

Drew Hirshfeld
*Performing the Functions and Duties of the
Under Secretary of Commerce for Intellectual Property and
Director of the United States Patent and Trademark Office*